(12) United States Patent
Song et al.

(10) Patent No.: US 7,969,808 B2
(45) Date of Patent: Jun. 28, 2011

(54) MEMORY CELL STRUCTURES, MEMORY ARRAYS, MEMORY DEVICES, MEMORY CONTROLLERS, AND MEMORY SYSTEMS, AND METHODS OF MANUFACTURING AND OPERATING THE SAME

(75) Inventors: Ki-Whan Song, Yongin-si (KR); Nam-Kyun Tak, Buchen-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 12/171,406

(22) Filed: Jul. 11, 2008

(65) Prior Publication Data

US 2009/0022003 A1    Jan. 22, 2009

(30) Foreign Application Priority Data

Jul. 20, 2007 (KR) ......................... 10-2007-0072962
Jul. 23, 2007 (KR) ......................... 10-2007-0073519
Aug. 9, 2007 (KR) ......................... 10-2007-0080152
Sep. 5, 2007 (KR) ......................... 10-2007-0090185
Jun. 12, 2008 (KR) ......................... 10-2008-0055182

(51) Int. Cl.
*G11C 11/00* (2006.01)

(52) U.S. Cl. ..................... 365/222; 365/189.05

(58) Field of Classification Search .......... 365/222, 365/189.05
See application file for complete search history.

(56) References Cited

U.S. PATENT DOCUMENTS

| | | | |
|---|---|---|---|
| 5,146,152 A | 9/1992 | Jin et al. | |
| 5,953,263 A | 9/1999 | Farmwald et al. | |
| 5,998,840 A | 12/1999 | Kim | |
| 6,055,183 A * | 4/2000 | Ho et al. | 365/185.09 |
| 6,060,750 A | 5/2000 | Hisamoto et al. | |
| 6,084,812 A | 7/2000 | Joo | |
| 6,147,903 A * | 11/2000 | Takahashi | 365/185.05 |
| 6,475,890 B1 | 11/2002 | Yu | |
| 6,567,330 B2 | 5/2003 | Fujita et al. | |
| 6,621,725 B2 | 9/2003 | Ohsawa | |
| 6,697,909 B1 | 2/2004 | Wang et al. | |
| 6,723,638 B1 | 4/2004 | He et al. | |
| 6,723,838 B1 | 4/2004 | Huganir et al. | |
| 6,826,074 B2 | 11/2004 | Yamauchi | |
| 6,861,689 B2 | 3/2005 | Burnett | |
| 6,861,889 B2 | 3/2005 | Tobita | |
| 6,882,008 B1 | 4/2005 | Ohsawa | |
| 6,982,918 B2 | 1/2006 | Fazan et al. | |
| 7,064,973 B2 | 6/2006 | Peng et al. | |
| 7,075,151 B2 | 7/2006 | Shino | |

(Continued)

FOREIGN PATENT DOCUMENTS

JP    04-366492    12/1992

(Continued)

OTHER PUBLICATIONS

"Bipolar Junction Transistor", *Wikipedia*, (http://en.wikipedia.org/wiki/Bit) (May 19, 2008).

(Continued)

*Primary Examiner* — Michael T Tran
(74) *Attorney, Agent, or Firm* — Harness, Dickey & Pierce, P.L.C.

(57) ABSTRACT

Example embodiments are directed to memory cell structures, memory arrays, memory devices, memory controllers, and memory systems using bipolar junction transistor (BJT) operation.

46 Claims, 21 Drawing Sheets

U.S. PATENT DOCUMENTS

| | | |
|---|---|---|
| 7,098,507 B2 | 8/2006 | Tang et al. |
| 7,154,788 B2 * | 12/2006 | Takemura et al. ........ 365/189.05 |
| 7,170,807 B2 | 1/2007 | Fazan et al. |
| 7,187,581 B2 | 3/2007 | Ferrant et al. |
| 7,233,536 B2 | 6/2007 | Ogiwara et al. |
| 7,301,803 B2 * | 11/2007 | Okhonin et al. ............. 365/177 |
| 7,326,634 B2 | 2/2008 | Lindert et al. |
| 7,338,862 B2 | 3/2008 | Huo et al. |
| 7,436,724 B2 | 10/2008 | Nandi |
| 7,442,988 B2 | 10/2008 | Oh et al. |
| 2002/0057622 A1 | 5/2002 | Sim |
| 2003/0231524 A1 | 12/2003 | Ohsawa |
| 2004/0256683 A1 | 12/2004 | Lee et al. |
| 2005/0026354 A1 * | 2/2005 | Bhattacharyya ............. 438/232 |
| 2005/0068807 A1 | 3/2005 | Ohsawa |
| 2005/0180214 A1 | 8/2005 | Park |
| 2006/0081851 A1 | 4/2006 | Ono |
| 2006/0092739 A1 | 5/2006 | Fujita et al. |
| 2006/0131650 A1 * | 6/2006 | Okhonin et al. ............. 257/347 |
| 2006/0138558 A1 | 6/2006 | Morikado |
| 2006/0208301 A1 | 9/2006 | Shino |
| 2007/0007574 A1 | 1/2007 | Ohsawa |
| 2007/0013007 A1 | 1/2007 | Kusunoki et al. |
| 2007/0023809 A1 | 2/2007 | Villaret et al. |
| 2007/0051994 A1 | 3/2007 | Song et al. |
| 2007/0058427 A1 | 3/2007 | Okhonin et al. |
| 2007/0090443 A1 | 4/2007 | Choi et al. |
| 2007/0091703 A1 | 4/2007 | Nishimura et al. |
| 2007/0097751 A1 | 5/2007 | Popoff et al. |
| 2007/0158727 A1 | 7/2007 | Song et al. |
| 2007/0161181 A1 | 7/2007 | Song et al. |
| 2007/0285982 A1 | 12/2007 | Carman |
| 2008/0012439 A1 | 1/2008 | Wu et al. |
| 2008/0130376 A1 | 6/2008 | Park et al. |
| 2008/0278473 A1 | 11/2008 | An |
| 2008/0284493 A1 | 11/2008 | Baek et al. |
| 2008/0303095 A1 | 12/2008 | Xiong et al. |

FOREIGN PATENT DOCUMENTS

| | | |
|---|---|---|
| JP | 2003-31696 | 1/2003 |
| JP | 2003-068877 | 3/2003 |
| JP | 2003-132682 | 5/2003 |
| JP | 2006085812 | 3/2006 |
| JP | 2006/107560 | 4/2006 |
| JP | 2006-108396 | 4/2006 |
| JP | 2006-156986 | 6/2006 |
| JP | 2006-179746 | 7/2006 |
| JP | 2006-260722 | 9/2006 |
| JP | 2007-018588 | 1/2007 |
| JP | 2007-0108588 | 1/2007 |
| JP | 2007-036257 | 2/2007 |
| JP | 2007-073680 | 3/2007 |
| KR | 10-1994-0003406 | 2/1994 |
| KR | 10-0248507 | 12/1999 |
| KR | 10-2002-0014757 | 2/2002 |
| KR | 10-2003-0015823 | 2/2003 |
| KR | 10-0429868 | 4/2004 |
| KR | 10-2005-0071665 | 7/2005 |
| KR | 10-0502374 | 7/2005 |
| KR | 10-0542161 | 1/2006 |
| KR | 10-2006-0104794 | 10/2006 |
| KR | 10-0660910 | 12/2006 |
| KR | 10-0663359 | 12/2006 |
| KR | 10-2066359 | 12/2006 |
| KR | 10-0673012 | 1/2007 |
| KR | 10-0682537 | 2/2007 |
| KR | 10-0699890 | 3/2007 |
| KR | 10/200/-0047105 | 5/2008 |
| KR | 10-2008-0058806 | 6/2008 |

OTHER PUBLICATIONS

Matloubian et al., "Modeling of the Subthreshold Characteristics of SOI MOSFET's with Floating Body," *IEEE Trans. On Elec. Devices*, vol. 17, No. 9, pp. 1984-1994 (Sep. 1990).

Takashi Ohsawa et al., "An 18.5ns 128Mb SOI DRAM with a Floating Body Cell", *ISSCC* 2005, Session 25, pp. 458-459, 609 (2005).

Chang Woo Oh et al., "Floating Body DRAM Characteristics of Silicon-on-ONO (SOONO) Devices for System-on-Chip (SoC) Applications", 2007 *Symp.on VLSI Tech. Digest of Tech. Papers.*, pp. 168-169 (2007).

"Capacitor-less IT DRAM cell structure for sensing margin and retention time enhancement", 2007 *The Korean Conference on Semiconductors*, (2007).

Hoon Jeong et al., "A Capacitor-less IT DRAM Cell Based on a Surrounding Gate MOSFET with a Vertical Channel", 2005 *IEEE Silicon Nanoelectronics Workshop*, pp. 92-93 (2005).

Takashi Ohsawa et al., "A Memory Using One-Transistor Gain Cell on SOI(FBC) with Performance Suitable for Embedded DRAM's", 2003 *Symp. On VLSI Circuits Digest of Technical Papers*, pp. 93-96 (2003).

Changhyun Cho et al., "A 6F$^2$ DRAM Technology in 60nm era for Gigabit Densities", 2005 *Symp. On VLSI Technology Digest of Technical Papers*, pp. 36-37 (2005).

K. Ota et al., "Novel Locally Strained Channel Technique for High performance 55nm CMOS", *IEEE*, pp. 27-30 (2002).

Takashi Ohsawa et al., "Memory Design Using a One-Transistor Gain Cell on SOI", *IEEE J .Solid State Circuits*, vol. 37, No. 11, pp. 1510-1522 (Nov. 2002).

Office Action dated Jun. 7, 2010 for related U.S. Appl. No. 12/348,036.

Michel Bron et al., "A 2ns Read Latency, 4Mb Embedded Z-Ram Floating Body Memory Macro in 45nm SOI Technology,".

Ki-Whan Song et al., "55nm Capacitor-less 1T DRAM Cell Transistor with Non-Overlap Structure".

Office Action dated Dec. 23, 2010 issued in related U.S. Appl. No. 12/654,333.

Office Action dated Jan. 3, 2011 issued in related U.S. Appl. No. 12/453,036.

Office Action dated Aug. 18, 2010 for related U.S. Appl. No. 12/285,520.

* cited by examiner

MEMORY CELL STRUCTURES, MEMORY ARRAYS, MEMORY DEVICES, MEMORY CONTROLLERS, AND MEMORY SYSTEMS, AND METHODS OF MANUFACTURING AND OPERATING THE SAME

PRIORITY STATEMENT

This application claims priority under 35 U.S.C. §119 to Korean Patent Application Nos. 2007-0072962 filed on Jul. 20, 2007, 2007-0073519, filed on Jul. 23, 2007, 2007-0080152, filed on Aug. 9, 2007, 2007-0090185, filed on Sep. 5, 2007, 2008-0055182, filed on Jun. 12, 2008, and 2008-0041784, filed on May 6, 2008, the contents of each of which are herein incorporated by reference in their entirety for all purposes.

BACKGROUND

1. Field

Memory cell structures, memory arrays, memory devices, memory controllers, and memory systems, and methods of manufacturing and operating the same.

2. Description of the Related Art

A conventional memory, for example, a DRAM, may include one transistor and one capacitor. However, there are limitations to the scalability of a conventional memory, due to the capacitor, in particular, the size of the capacitor. As a result, memories including one transistor (1T) and no capacitor as a memory cell, referred to as "capacitor-less" memories, have been developed. A capacitor-less 1T DRAM, hereinafter referred to as a conventional capacitor-less DRAM, may include a body that is electrically floated.

Generally, a conventional capacitor-less memory utilizes a silicon-on-insulator (SOI) wafer and identifies data controlling the floating body voltage by accumulating a majority carrier (either holes or electrons) in the floating body or by emitting the majority carrier from the floating body. When the majority carrier is accumulated in the floating body, this state is generally represented by a data "1". Conversely, when the majority carrier is evacuated from the floating body, this state is generally referred to as a data "0" state.

There are two types of operation for a conventional capacitor-less memory device. The first is using the characteristics of MOS operation and the second is using the characteristics of BJT operation. In general, using the characteristics of BJT operation has been introduced and may have higher speed and/or better retention properties than MOS operation.

SUMMARY

Example embodiments are directed to memory cell structures, memory arrays, memory devices, memory controllers, and memory systems, and methods of manufacturing and operating the same. Example embodiments are directed to memory cell structures, memory arrays, memory devices, memory controllers, and memory systems using BJT operation.

Example embodiments are directed to memory devices including a memory array further including a plurality of memory cells, each memory cell including a floating body transistor having a first node, a second node, and a gate node, connected to at least one bit line, at least one source line and at least one word line, respectively, and a control unit for performing a refresh operation in response to a refresh command by selecting one of the at least one source line and the at least one bit line, wherein if first data is stored at a memory cell connected to the selected line, a first current caused by bipolar junction operation flows.

Example embodiments are directed to memory devices including a memory array further including a plurality of memory cells, each memory cell including a floating body transistor having a first node, a second node, and a gate node, connected to at least one bit line, at least one source line and at least one word line, respectively and a control unit for performing a write operation by applying a bit line write voltage to the at least one bit line according to data information, then applying a source line write voltage to the at least one source line, and then applying a word line write voltage to the at least one word line.

Example embodiments are directed to memory cell structures including a silicon-on-insulator structure further including a substrate, an insulator, and a silicon layer, the silicon layer including first and second nodes doped with impurities, a floating body region, and a buffer region between one of the first and second nodes and the floating body, wherein the buffer region has a lower impurity concentration that the adjacent node or the floating body and wherein the buffer region covers the entire boundary of the one of the first and second nodes, and a gate structure on the silicon layer.

Example embodiments are directed to memory cell structures including a silicon-on-insulator structure further including a substrate, an insulator, and a silicon layer, the silicon layer including first and second nodes doped with impurities, a floating body region having a floating body length therebetween, and a buffer region between one of the first and second nodes and the floating body, wherein the buffer region has a lower impurity concentration that the adjacent node or the floating body, and a gate structure having a gate length on the silicon layer, wherein the floating body length is greater than the gate length.

Example embodiments are directed to memory cell structures including a silicon-on-insulator structure further including a substrate, an insulator, and a silicon layer, the silicon layer including an emitter/source and a collector/drain doped with impurities, a floating body region, and an auxiliary body region between the emitter/source and the floating body, wherein the auxiliary body region has a lower impurity concentration that the floating body, and a gate structure on the silicon layer.

Example embodiments are directed to memory cell structures including a silicon-on-insulator structure further including a substrate, an insulator, and a silicon layer, the silicon layer including first and second nodes doped with impurities, a floating body region, and an extended body region adjacent to the floating body region, and a gate structure on the silicon layer.

Example embodiments are directed to memory cell structures including an insulating layer on a substrate, a silicon pattern on the insulating layer and including a first node, second node and a floating body region, and a gate surrounding the floating body region, wherein the length of the gate is less than the floating body region and wherein a voltage difference between voltages applied to the first and second nodes for a given voltage applied to the gate induces a bipolar junction operation.

Example embodiments are directed to memory cell structures including an insulating layer on a substrate, a silicon pattern on the insulating layer, which including a first node, second node and a floating body region, an extended body region on the floating body region, and a gate structure surrounding the floating body region and the extended body region.

Example embodiments are directed to methods for controlling a memory device including a plurality of capacitor-less memory cells, including providing a mode register set (MRS) command for identifying one of a block refresh operation and a partial refresh operation, and providing a refresh command for the refresh operation.

Example embodiments are directed to memory controllers including a register storing an MRS command for selecting one of block refresh and a partial refresh.

Example embodiments are directed to capacitor-less memory devices, including a register storing information for selecting one of a block refresh and a partial refresh.

Example embodiments are directed to memory cell structures including a silicon-on-insulator structure including a substrate, an insulator, and a silicon layer, the silicon layer including first and second nodes, a floating body region, and a gate on the floating body region, wherein the length of gate is less than the length of the floating body, and wherein a difference between voltages applied to the first and second nodes for a given voltage applied to the induces a bipolar junction operation.

Example embodiments are directed to memory devices including a memory array including a plurality of memory cells, each memory cell including a floating body transistor having a first node, a second node and a gate, connected to at least one bit line, at least one source line and at least one word line, respectively and a control unit for performing a read operation by selecting one of the at least one source line and by not selecting any of the at least one word lines, wherein if first data is stored at a memory cell connected to the selected source line, a first current caused by bipolar junction operation flows.

BRIEF DESCRIPTION OF THE DRAWINGS

Example embodiments will be described in more detail with reference to the accompanying drawings.

DETAILED DESCRIPTION

Figure 1A:
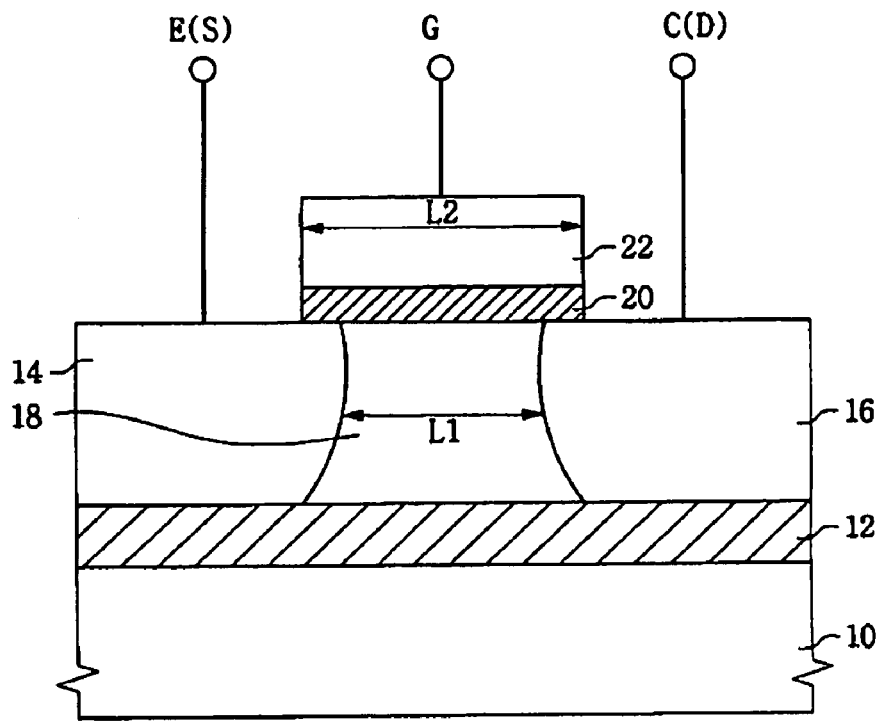
FIG. 1A illustrates a lateral capacitor-less memory cell structure in which example embodiments may be implemented.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another components or features as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these figures but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claims.

FIG. 1A illustrates an example of lateral capacitor-less memory cell in which example embodiments may be implemented. As illustrated in FIG. 1A, a lateral capacitor-less memory cell may include a substrate 10. In example embodiments, the substrate may be one of P-conductivity type or N-conductivity type substrate. In example embodiments of an NMOS transistor, the substrate 10 is a P-conductivity type substrate.

The memory cell may further include an insulating layer 12 on the substrate 10. The insulating layer 12 is the insulator in an SOI arrangement. The memory cell may further include a silicon layer having a first node 14 and a second node 16 and a floating body 18 on the insulating layer 12. In MOS operation, the first and second node 14 and 16 may be referred to as the source S and drain D. In BJT operation, the first and second node 14 and 16 may be referred to as the emitter E and collector C. It is noted that the first and second node 14 and 16 are interchangeable. In example embodiments, the first and second nodes 14 and 16 may be N-conductivity type or P-conductivity type. In example embodiments of an NMOS transistor, the first and second nodes 14 and 16 are N-conductivity type.

The memory cell may further include the floating body region 18 between the first and second node 14 and 16 and on the insulating layer 12, which may be of the opposite conductivity type as the first and second node 14 and 16. In example embodiments of an NMOS transistor, illustrated in FIG. 1A, the floating body region 18 is P-conductivity type. As a result, the BJT illustrated in FIG. 1A is an NPN-conductivity type BJT. The floating body region 18 is floating electrically as a result of the separation of floating body region 18 from the substrate 10 by the insulating layer 12. As shown in FIG. 1A, the floating body region 18 may have a floating body length L1.

The memory cell may further include a gate structure G which may include gate insulating layer 20 and gate 22. The gate 22 may have a gate length L2. As shown in FIG. 1A, a lateral capacitor-less memory cell having a floating body 18 may be formed on the insulating layer 12, which is further formed on the silicon substrate 10. As set forth above, which node is considered the emitter/source E/S or collector/drain C/D is relative; as a result, in example embodiments, the terminology first and second node is utilized.

In general, the emitter/source E/S is the node to which a lower voltage is applied, whereas the collector/drain C/D is the node to which a higher voltage is applied. In general, L1 may define the distance between the emitter/source E/S and collector/drain C/D and L2 may define the gate length. In example embodiments, L2 is greater than L1; in general because self-alignment technology or LDD (Light Doped Drain) may be used to form the emitter/source E/S and collector/drain C/D and then thermal treatment is applied for their stabilization.

Figure 1B:
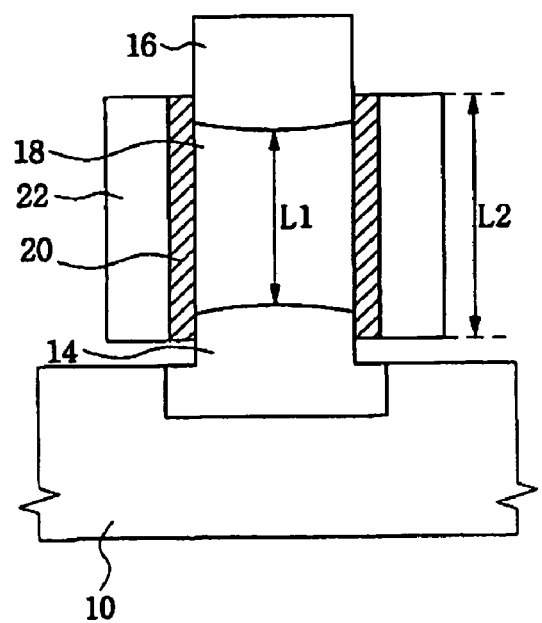
FIG. 1B illustrates a vertical capacitor-less memory cell structure in which example embodiments may be implemented.

FIG. 1B illustrates an example of vertical capacitor-less memory cell in which example embodiments may be implemented. As illustrated in FIG. 1B, a vertical capacitor-less memory cell may include a substrate 10, a first node 14, a floating body region 18, and a second node 16 vertically stacked on the substrate 10. The floating body region 18 is floating electrically. As shown in FIG. 1B, the floating body region 18 may have a floating body length L1.

The gate insulating layer 20 and gate 22 may surround the floating body 18. For example, the gate insulating layer 20 and gate 22 may contact all or a portion of two or more sides of the floating body 18. In example embodiments, L2 is greater than L1.

If the vertical capacitor-less memory cell is an NMOS transistor, the first and the second node 14 and 16 may be of a first conductivity type, for example, N-conductivity type, and the floating body region 18 may be of a second conductivity type, for example, P-conductivity type. Also, a vertical capacitor structure may have an SOI substrate or a conventional bulk substrate as shown in FIG. 1B.

Figure 2:
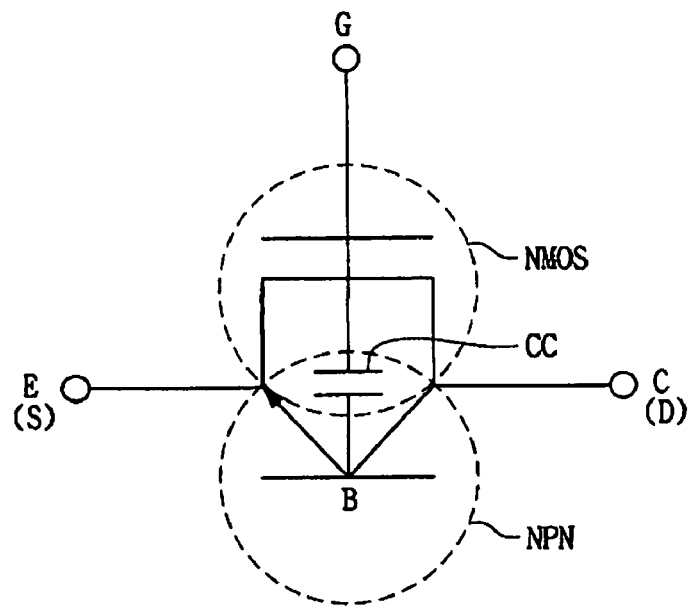
FIG. 2 illustrates an equivalent circuit of a capacitor-less memory cell in which example embodiments may be implemented.

FIG. 2 illustrates an equivalent circuit of a capacitor-less memory cell of FIG. 1A and FIG. 1B. As illustrated in FIG. 2, the equivalent circuit includes one NMOS transistor and one NPN bipolar junction transistor. For example, the emitter/source E/S, collector/drain C/D and gate G of FIGS. 1A and 1B form an NMOS transistor. Similarly, the emitter/source E/S, the collector/drain C/D, and the electrically floating region 18 (or base B) of FIGS. 1A and 1B form a BJT of NPN type. Also as shown in FIG. 2, a coupling capacitor CC may be formed between the gate G of the NMOS transistor and the base B of the BJT.

In example embodiments, the BJT is used to program/write as well as read and refresh the memory cell. In this regard, the BJT generates and/or produces a bipolar transistor current which is used to program/write a data state in the memory cell, read the data state of the memory cell, and refresh the data state of the memory cell.

Figure 3:
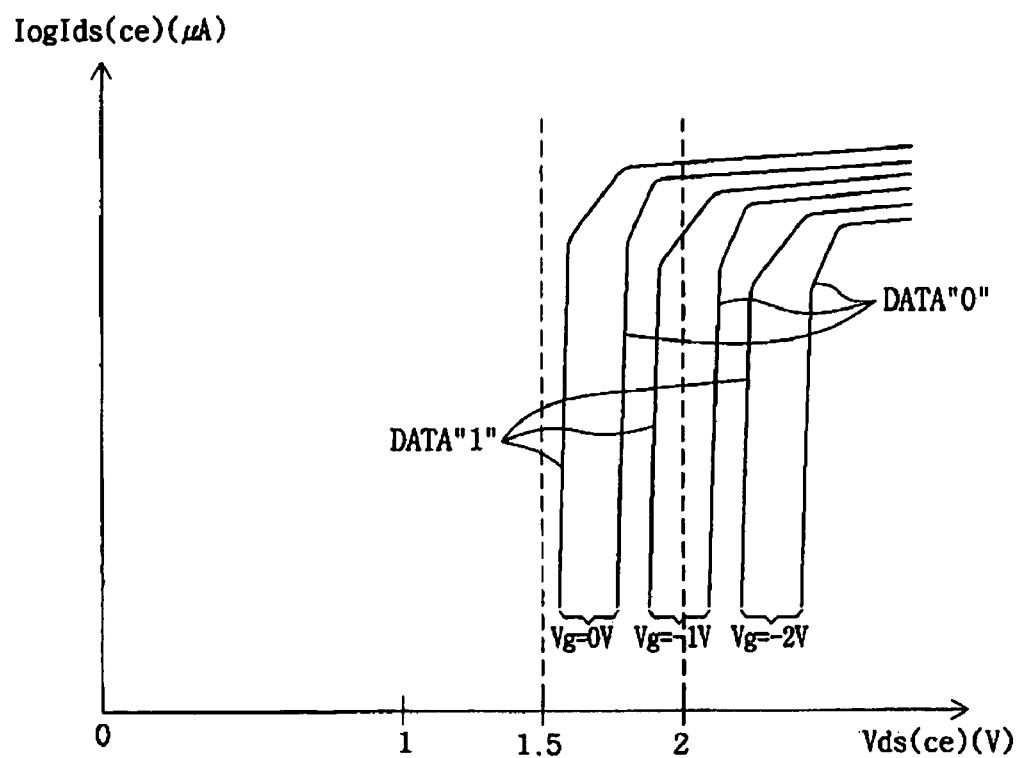
FIG. 3 illustrates DC characteristics of a capacitor-less memory cell in accordance with example embodiments.

FIG. 3 illustrates DC characteristics of a capacitor-less memory cell in accordance with example embodiments. As illustrated in FIG. 3, for example, when $V_g$ is set to 0 volts, −1 volts, and −2 volts, respectively, while sweeping $V_{ds}$ (or $V_{ce}$)

from 0 volts to a higher voltage, log $I_{ds}$ (or $I_{ce}$) in μA is shown to vary. As illustrated in FIG. 3, each left line in every case may be used to identify data "1", whereas each right line in every case may be used to identify data "0". The difference between the left line identifying data "1" and the right line identifying data "0" for each $V_g$ may be referred to as the sensing margin. A majority carrier in the floating body region 18 for data "1" is greater than that of data "0". In particular, FIG. 3 illustrates an abrupt change in current flow when $V_{ds}$ is above 1.5 volts in all three cases. The abrupt current increase is explained below.

As shown in FIGS. 2 and 3, raising the voltage $V_{ds}$ increases the potential of the electrically floating region 18 or body B, which generates a forward bias between the emitter/source E/S and the base B and a reverse bias between the base B and the collector/drain C/D so the BJT turns "on". As a result, electrons migrate from the emitter/source E/S through the body B to the junction between base B and collector/drain C/D. These electrons collide into the silicon lattice in the junction and generate electron-hole pairs. This may be referred to as impact ionization or band-to-band tunneling.

For each electron-hole pair, the electrons move toward the collector/drain C/D and the holes move toward the base B. Again, a voltage of the base B rises and more electrons from the emitter/source E/S are injected into the floating body and reach the junction between the base B and collector/drain C/D via the body B, thereby repeating the above cycle. Due to this positive feedback, the multiplication may be large, and may be referred to as "avalanche generation". As a result of this positive feedback, holes are accumulated in a floating body region. This state may be referred to as data state "1".

As illustrated in FIG. 3, BJT operation occurs sooner where $V_g=0$ volts than for $V_g=-1$ volts and $V_g=-2$ volts. This is because the static potential of the body of $V_g=0$ is larger and the voltage between the base B and emitter/source E/S of a larger $V_g$ reaches forward bias than that of a smaller $V_g$. For similar reasons, the BJT operation of data "1" occurs faster than that of data "0".

Figure 4:
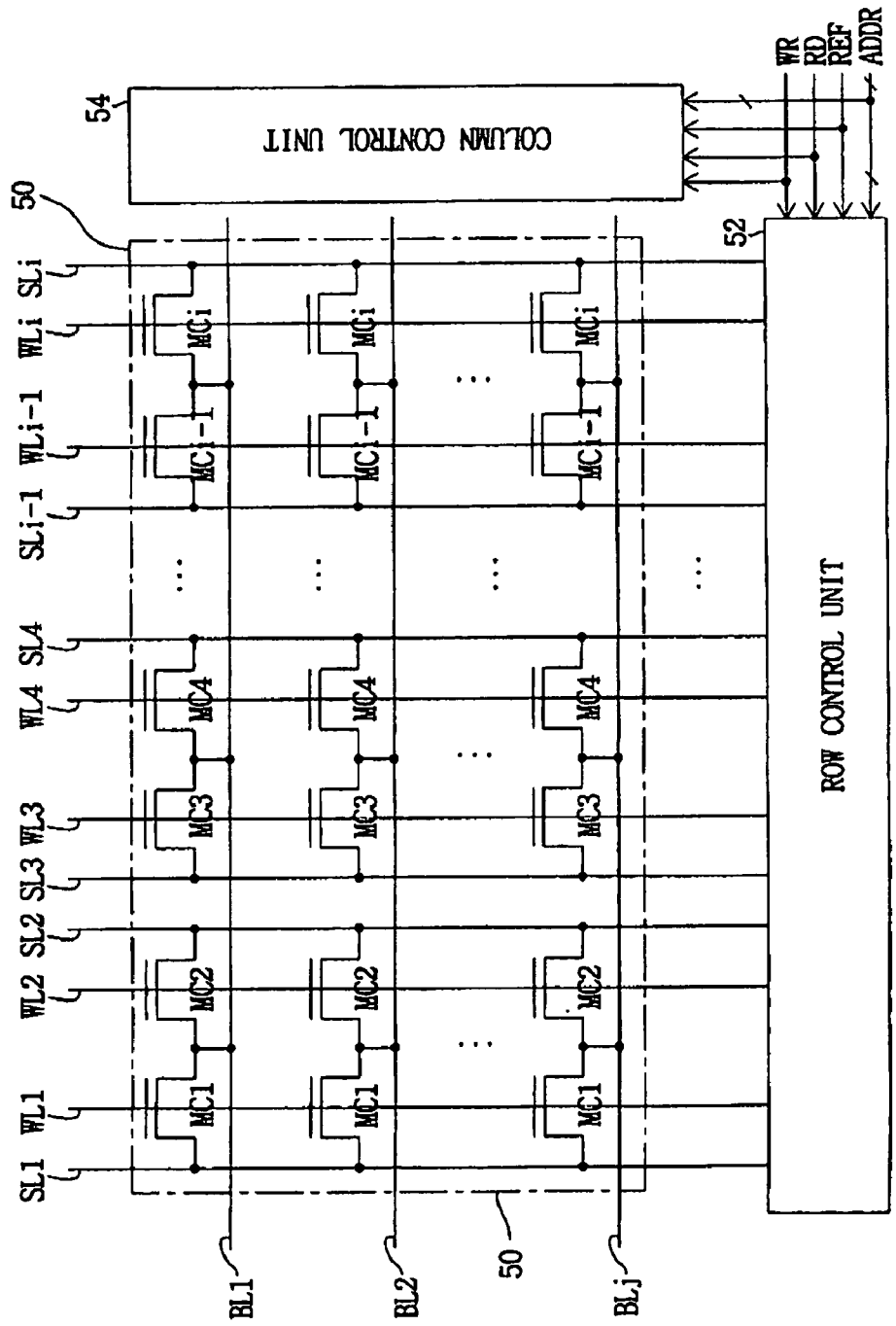
FIG. 4 illustrates a memory device in accordance with example embodiments with a separated source line architecture in which example embodiments may be implemented.

FIG. 4 illustrates a memory device in accordance with example embodiments. FIG. 4 illustrates a memory device including a memory array 50, a row control unit 52 and a column control unit 54.

The memory array 50 includes a plurality of capacitor-less memory cells MC1-MCi. Each memory cell is connected to row control unit 52 and column control unit 54, each of which receive write signals WR, read signals RD, refresh signals REF, and/or address signals ADD. Each of the memory cells MCi is also connected to a word line WL1 ... WLi, a source line SL1 ... SLi, and a bit line BL1 ... BLj. As shown in FIG. 4, each row of memory cells MCi has a corresponding word line WLi and source line SLi, namely, the number of word lines and the number of source lines is equal. This architecture may be referred to as a separate source line architecture. In example embodiments illustrated in FIG. 4, a first node is connected to a source line SLi and a second node is connected to a bit line BLi. As shown in FIG. 4, the word lines WLi and source lines SLi may be in the same direction, whereas the bit lines BLi are perpendicular to the word lines WLi and source lines SLi.

As shown in FIG. 4, row control unit 52 may receive addresses ADD for selection of one of the word lines WLi and at least one of the source lines SLi in response to one of a write WR, read RD, and refresh REF signal. The column control unit 54 may receive addresses ADD for selection of one of the bit lines BLi in response to one of the write WR and read RD signals.

The column control unit 54 may provide the selected bit line with data information during a write operation and may receive data information from the selected bit line during a read operation. Also, the column control unit 54 may supply a desired voltage level to at least one of the bit lines BLi during a refresh operation.

In example embodiments, the refresh REF signal may be provided by an external device or may be generated by internally counting a refresh period.

Although the row control unit 52 and column control unit 54 are illustrated as separate units in FIG. 4, the functions of these two control units may be implemented in a single control unit.

Figure 5:
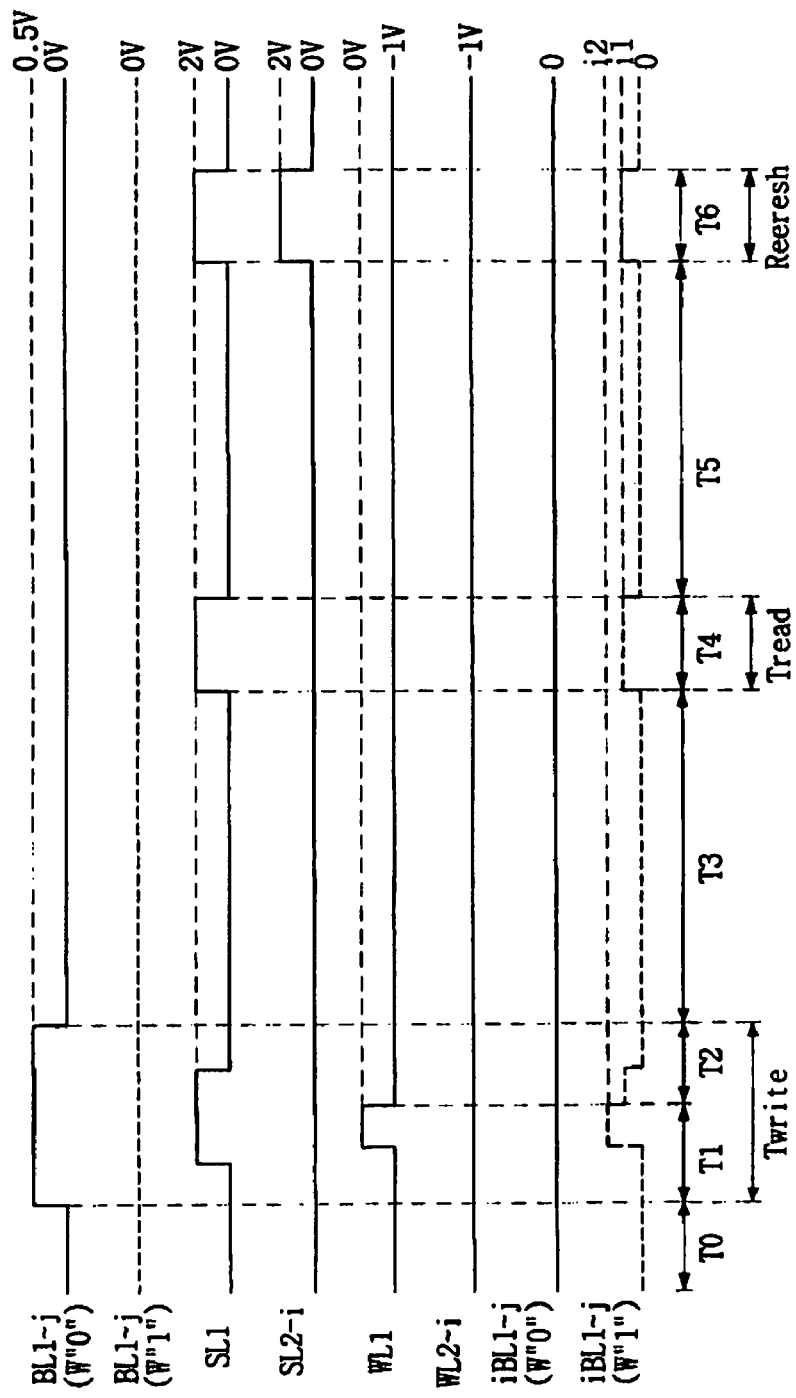
FIG. 5 illustrates an example timing diagram for a row operation in accordance with example embodiments with a separated source line architecture.

FIG. 5 illustrates an example timing diagram for a row operation of the memory device of FIG. 4. FIG. 5 illustrates an example timing diagram for a write operation (for writing both a data "1" and a data "0"), a read operation and a refresh operation. In example embodiments discussed below, the refresh operation may be a block refresh operation or a partial refresh operation. In a block refresh operation, all memory cells are refreshed simultaneously. A block refresh operation is a faster refresh operation, but requires a large amount of current. In a partial refresh operation, a subset of cells (for example two, or four, or eight) is refreshed simultaneously, and each subset is refreshed consecutively until all memory cells are refreshed. A partial refresh operation results in a slower refresh operation, but requires a lower current.

As shown in FIG. 5, time intervals T0, T3, and T5 identify hold or pre-charge or standby status, which may precede and/or succeed a write, read or refresh operation. Time intervals T1 and T2 identify a write interval $T_{write}$, T4 identifies a read interval $T_{read}$, and T6 identifies a refresh interval $T_{refresh}$. For BL1-j during write operation and iBL1-j during write, read and refresh operation, a solid line is utilized for data "0" and a dotted line is used for data "1".

As shown in FIG. 5, one complete row of cells MC1 connected to WL1 and SL1 is written with data "1" or data "0" during the write interval $T_{write}$, and read out during the read interval $T_{read}$. However, this is merely an example, and any data may be written to any row of cells MCi.

Prior to a write operation, as shown in time interval T0, bit lines BLj have a bit line holding voltage applied thereto, for example, 0 volts, source lines SLi have a source line holding voltage applied thereto, for example, 0 volts, and word lines WLi have a word line holding voltage applied thereto, for example, −1 volts, as shown in FIG. 5.

As illustrated in FIG. 5, during T1, if it is desired to write data "0" to the complete row of cells MC1, the column control unit 54 supplies a bit line write voltage of a first level, for example, 0.5 volts, to bit lines BL1~j.

If it is desired to write data "1" to the complete row of cells MC1, the column control unit 54 supplies a bit line write voltage of a second level, for example, 0 volts to bit line bit lines BL1~j. In example embodiments, the second level of the bit line write voltage may be the same as the bit line holding voltage, for example, 0 volts.

All other rows of cells MC2 ... i may be maintained in a hold state, with bit line holding voltages, for example, 0 volts, source line holding voltages, for example, 0 volts, and word line holding voltages, for example, −1 volts, applied thereto.

Then, the row control unit 52 supplies a source line write voltage, for example, 2 volts, to SL1 and continues to supply the source line holding voltage, for example, 0 volts, to all other sources lines SL2-i.

Then, the row control unit 52 supplies a word line write voltage, for example, 0 volts to WL1 and continues to supply the word line holding voltage, for example, −1 volts, to all other word lines WL2-i.

As shown in FIG. 5, first, the bit line write voltage (where the level depends on the data information to be written) is applied to the bit lines BL1~j. Next, the source line write voltage is applied to the source line SL1. Finally, the word line write voltage is applied to the word line WL1. As shown in FIG. 5, the current I1 flows through bit line BL1~j when the bit line write voltage, the source line write voltage, and the word line write voltage are applied for writing data "1".

As illustrated in the timing diagram of FIG. 5, for data "1", during T1, Vds is 2 volts and Vg is 0 volts, so according to FIG. 3, a current I1 through bit line BL1~j is caused by the avalanche generation of BJT operation. For data "1", during T2, Vds is 2 volts and Vg is −1 volts, so according to FIG. 3, a current I1 through bit line BL1~j is also caused by the avalanche generation of BJT operation. As shown in FIG. 5, the current I1 through bit line BL1~j, during time period T2 is smaller than I2 because the body potential decreases as a result of the coupling effect of coupling capacitor CC.

As illustrated in the timing diagram of FIG. 5, for data "0", during T1, Vds is 1.5 volts and Vg is 0 volts , so according to FIG. 3, no avalanche generation of BJT operation occurs and a hole may be evacuated to the bit line BL1~j by the gate coupling effect. As a result, no current flows through bit line BL1~j. Similarly, for data "0", during T2, Vds is 1.5 volts and Vg is −1 volts, so according to FIG. 3, no avalanche generation of BJT operation occurs. As a result, no current flows through bit line BL1~j.

The bit line write voltage should be applied before the source line write voltage, because if the source line SL1 changes to 2 volts before the bit line BL1, a voltage between the collector/drain C/D and emitter/source E/S $V_{ds}$ becomes 2 volts. As shown in FIG. 3, BJT operation will occur and holes may be accumulated in the floating body B. As a result, a data "1" may be rewritten, regardless of the data information desired.

As shown in FIG. 5, the application of the bit line write voltage (or any voltage) may not be instantaneous. As such, the bit line write voltage may begin to be applied before the source line write voltage is applied or the bit line write voltage may reach a constant state (for example, the first level) before the source line write voltage is applied.

The source line write voltage should be applied prior to the word line write voltage because if the word line write voltage changes to 0 volts before the source line SL1, holes in the floating body B may be evacuated to the bit line BL1 by a coupling effect of the coupling capacitor CC. As a result, data "0" may be written, regardless of the data information desired.

Also, as illustrated in the timing diagram of FIG. 5, during T2, the word line holding voltage is re-applied on the word line WL1 before the source line holding voltage is re-applied on the source line SL1. Similarly, the source line holding voltage on the source line SL1 is re-applied before the bit line holding voltage is reapplied on the bit line BL1. In particular, the word line holding voltage is re-applied on the word line WL1 prior to re-applying the source line holding voltage on the source line SL1 because if the source line SL1 changes to 0 volts before the word line WL1, holes in the floating body B may be removed into the source line SL1 due to a forward bias between the floating body B and the source line SL1. As a result, data "1" written to the memory cell MC1 may be damaged.

Additionally, the source line holding voltage on the source line SL1 is re-applied before the bit line holding voltage is re-applied on bit line BL1 because if the bit line BL1 changes to 0 volts before the source line SL1, a voltage across the collector/drain C/D and emitter/source E/S $V_{ds}$ becomes 2 volts and BJT operation may occur. As a result, data "0" written to the memory cell MC1 may be damaged.

Although FIG. 5 shows that all memory cells connected WL1 and BL1-j are written by one of data "1" and data "0", it is for the brevity of explanation. Also, each memory cell can be written with data "1" or data "0" according to the voltage of the corresponding bit line.

FIG. 5 also illustrates a read operation in accordance with example embodiments. As shown in FIG. 5, a read operation during T4 is performed for one row of cells connected to word line WL1 and source line SL1.

Prior to a read operation, as shown in time interval T3, bit lines BLi have a bit line holding voltage applied thereto, for example, 0 volts, source lines SLi have a source line holding voltage applied thereto, for example, 0 volts, and word lines WLi have a word line holding voltage applied thereto, for example, −1 volts, as shown in FIG. 5.

Then, the row control unit 52 supplies a source line read voltage, for example, 2 volts, to SL1 and continues to supply the source line holding voltage, for example, 0 volts, to all other sources lines SL2-i. The row control unit 52 continues to supply a word line holding voltage, for example, −1 volts to WL1-i.

In example embodiments, a read operation may be performed by supplying only a source line read voltage connected to memory cell to be read. For a read operation, bit line BL1~j may be electrically floating after pre-charging by the holding voltage and the voltage of BL1~j may be changed according to stored data in memory cell, that is, the column control unit 54 need not supply a holding voltage to the bit lines during a read operation. Also, the above explanation is applicable when a voltage sense amplifier is used as bit line sense amplifier, but not if a current sense amplifier is used.

All other rows of cells MC2 . . . i may be maintained in a hold state, with bit line holding voltages, for example, 0 volts, source line holding voltages, for example, 0 volts, and word line holding voltages, for example, −1 volts, applied thereto.

As shown in FIG. 3, once the voltage across the drain and source $V_{ds}$ reaches 2 volts, when $V_g$ is −1 volt, BJT operation occurs only for a data "1" cell and not for a data "0" cell. That is, a read current I1 created by BJT operation flows for a data "1" cell and a read current I1 does not flow for a data "0" cell (the sensing margin). In example embodiments, the write current I1 may be same as the read current I1.

As a result, the data can be identified by subsequent sense amplification utilizing, for example, a current sense amplifier or a voltage sense amplifier. In example embodiments, in a row operation, such as that illustrated in FIG. 5, as many sense amplifiers as bit lines are needed because data for each of the bit lines is read.

Additionally, data "1" and data "0" stored in a memory cell connected to the selected source line SL1 may be restored by BJT operation and coupling effect, respectively, during a read operation.

FIG. 5 also illustrates a refresh operation in accordance with example embodiments.

Prior to a refresh operation, as shown in time interval T5, bit lines BLi have a bit line holding voltage applied thereto, for example, 0 volts, source lines SLi have a source line holding voltage applied thereto, for example, 0 volts, and word lines WLi have a word line holding voltage applied thereto, for example, −1 volts, as shown in FIG. 5.

When a refresh command is issued by an external device or an internal control circuit, the row control unit 52 supplies a refresh voltage, for example, 2 volts, to all the source lines SL1-j. Also, the row control unit 52 may supply the refresh voltage to at least one or two source line one after another, so that a current issue can be reduced during the refresh operation. The number of source lines activated at a time for the refresh operation may be set by a user by using set up step, described in more detail below in conjunction with FIG. 20.

Only supplying sources lines SLi with a voltage that can cause BJT operation at data cell "1" refreshes all memory cells connected to the sources lines SLi. That is, data "1" memory cell is refreshed by BJT operation and data "0" cell is refreshed by the coupling effect between the source line SLi and the floating body B. The row control unit 52 continues to supply a word line holding voltage, for example, −1 volts to WL1-i.

As shown in FIG. 5, during the refresh period $T_{refresh}$, a current I1 through bit line BL connected to the data "1" cell flows. In example embodiments, the refresh current I1 may be same as the read current I1 and/or the write current I1.

In example embodiments, the refresh operation may be executed by supplying the refresh voltage to at least one of the bit lines instead of the voltage to at least one of the source lines.

As shown in FIG. 5, all sources lines SLi are being refreshed. If the voltage that can cause BJT operation is supplied to all source lines or all bit lines, all memory cells may be refreshed. This may be referred to as a block refresh.

In example embodiments, the number of selected source lines for a simultaneous refresh operation may be a subset of the total number of source lines (for example, two, or four, or eight) in a mode register, by a user, which will discussed in more detail below with regard to FIG. 20. As discussed above, this may be referred to as a partial refresh operation.

In example embodiments, the refresh operation need not be followed by a sensing operation.

Figure 6:
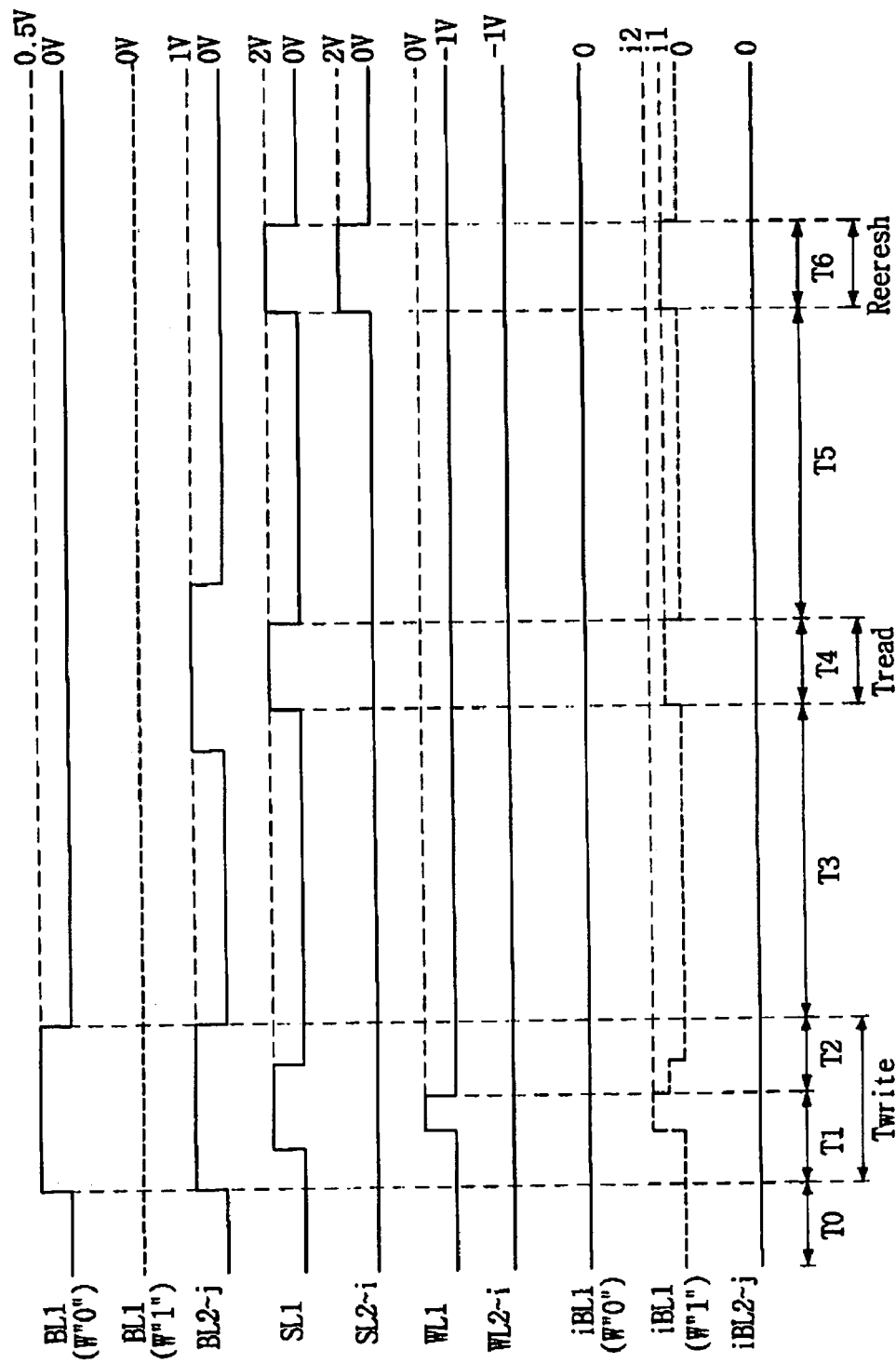
FIG. 6 illustrates an example timing diagram for one cell operation in accordance with example embodiments with a separated source line architecture

FIG. 6 illustrates a timing diagram for one cell operation of the memory device of FIG. 4. FIG. 6 illustrates an example timing diagram for a write operation (for writing both a data "1" and a data "0"), a read operation and a refresh operation. In example embodiments discussed below, the refresh operation may be a block refresh operation or a partial refresh operation.

As shown in FIG. 6, a write operation and a read operation is performed for only a memory cell MC1 connected to bit line BL1, SL1 and WL1 and all other MC1 cells connected to SL1 and WL1 are in an inhibit condition. Other than the inhibit condition for both the write operation and a read operation, the description of FIG. 6 is the same as for FIG. 5.

As described above, the difference between FIG. 5 and FIG. 6 is that, in FIG. 6 only a single cell is being written or read, instead of an entire row. As a result, in FIG. 6, the remainder of the cells in the row which are not being written or read are inhibited. In example embodiments, the remainder of the cells in the row are inhibited from being written or read by the application of a bit line write inhibit voltage or a bit line read inhibit voltage, respectively, on bit lines BL2~j.

For a write operation, during T1 and T2, a bit line write inhibit voltage, for example, 1 volt, is applied on bit lines BL2~j. As a result, Vds is 1 volt, and as shown in FIG. 3, BJT operation is prevented and there is no current flow.

Similarly, for a read operation, during T4, a bit line read inhibit voltage, for example, 1 volt, is applied on bit lines BL2~j. As a result, Vds is 1 volts, and as shown in FIG. 3, BJT operation is prevented and there is no current flow.

As shown in FIG. 6, with respect to a refresh operation, the refresh operation is the same as FIG. 5.

The timing diagram of FIG. 6 makes it clear that random access operation of a memory cell array 50 is possible.

As shown in FIG. 5 and FIG. 6, the memory device needs only two voltage levels, the word line write voltage and the word line holding voltage, for the write, the read and the refresh operation, which may allow greater flexibility for a designer.

Figure 7:
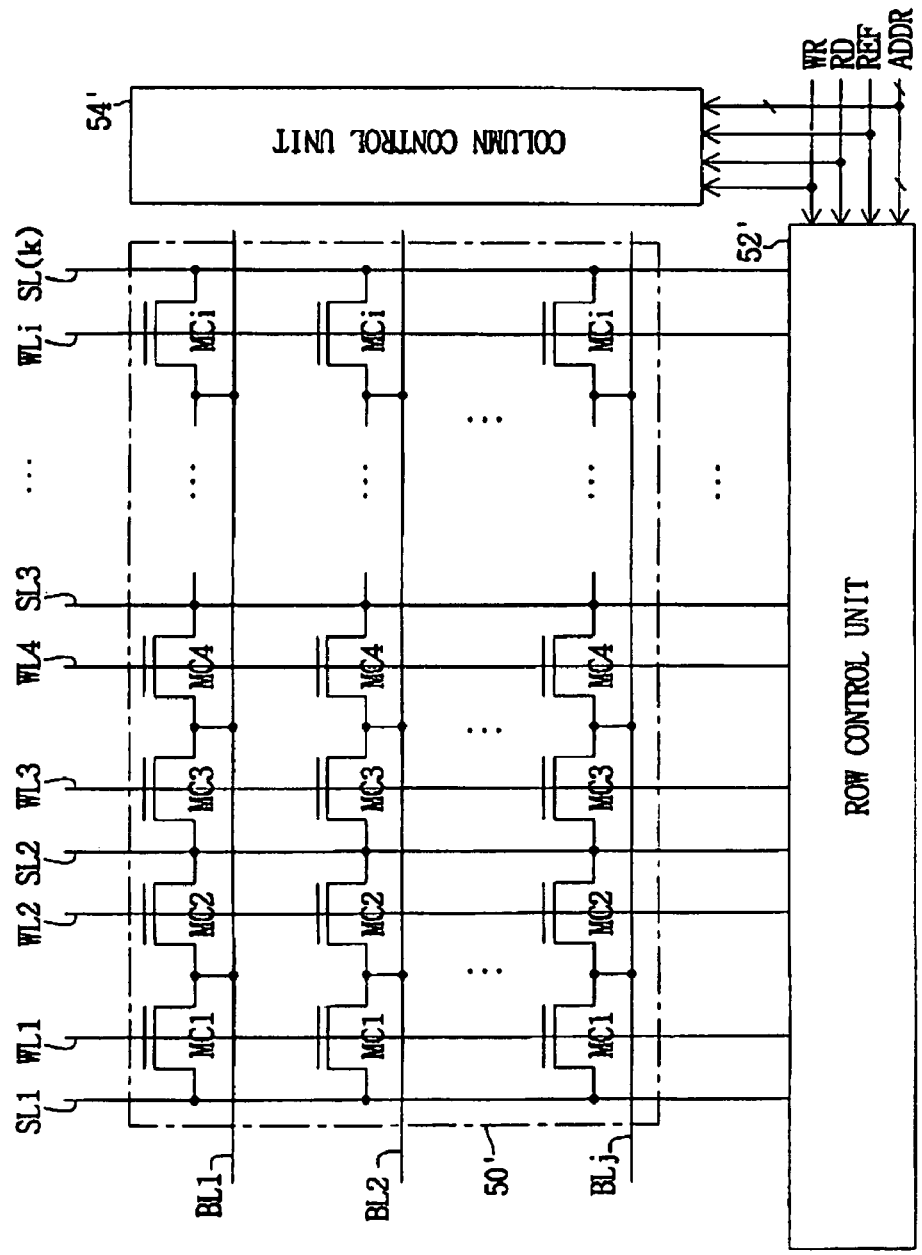
FIG. 7 illustrates a memory device in accordance with example embodiments with a common source line architecture in which example embodiments may be implemented.

FIG. 7 illustrates a memory device in accordance with example embodiments. In contrast to the memory device according to example embodiments illustrated in FIG. 4, which illustrates a separate source line architecture, the memory device in accordance with example embodiments of FIG. 7 illustrates a common source line architecture that adjacent memory cells MC2 and MC3 share a corresponding source line SL2, for example. A description of the remainder of FIG. 7 is the same as for FIG. 4 and will not be repeated for the sake of brevity.

As shown in FIG. 7, the number of source lines SLk is fewer than the number of word lines WLi. An advantage of such an arrangement may be reducing layout complications. Additionally, as set forth in example embodiments of FIG. 4, the row control unit 52 and column control unit 54 may be implemented as a single control unit.

Figure 8:
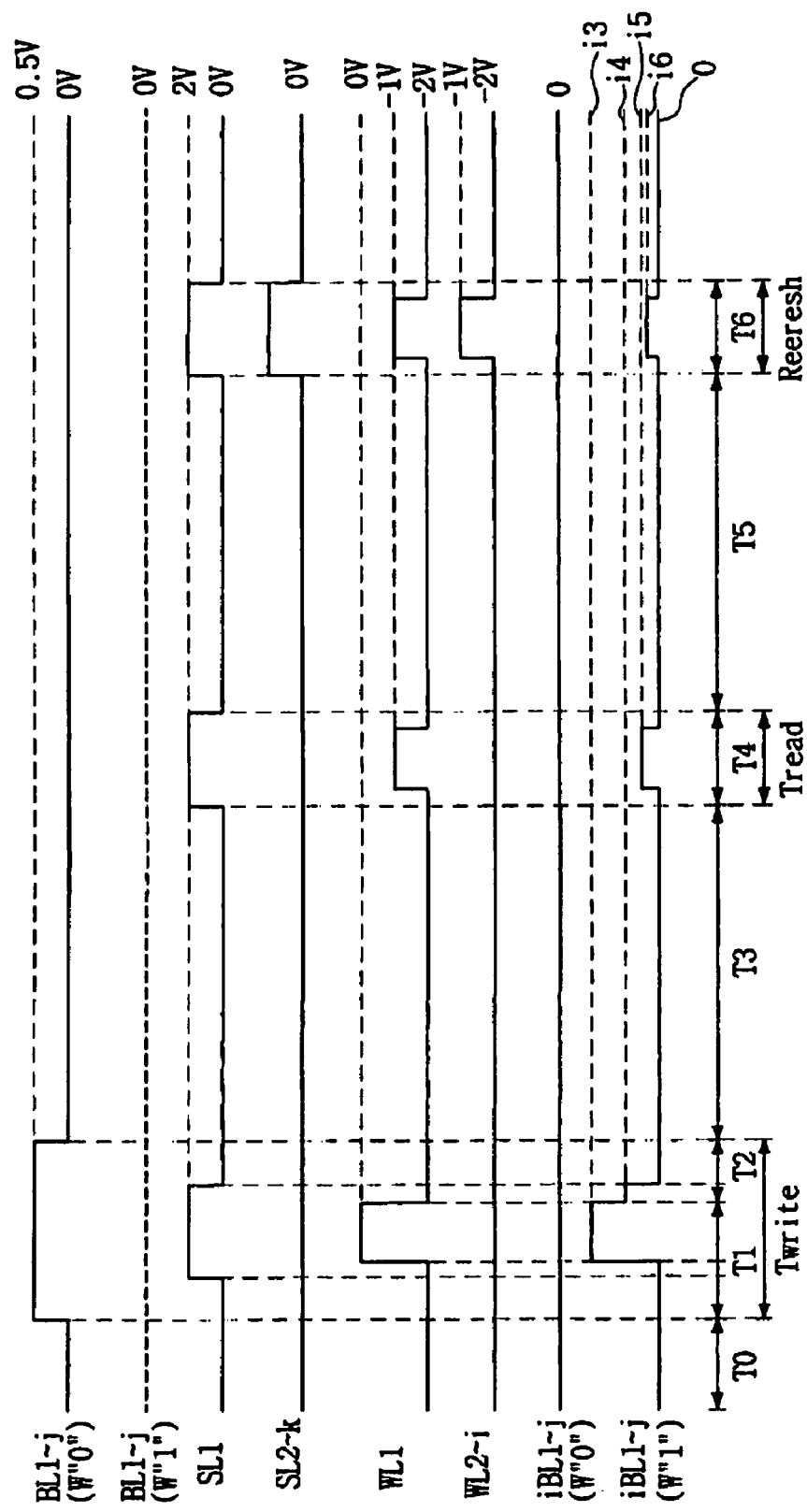
FIG. 8 illustrates an example timing diagram for a row operation in accordance with example embodiments with a common source line architecture.

FIG. 8 illustrates a timing diagram for a row of the memory device of FIG. 7. FIG. 8 illustrates an example timing diagram for a write operation (for writing both a data "1" and a data "0"), a read operation and a refresh operation. In example embodiments discussed below, the refresh operation may be a block refresh operation or a partial refresh operation.

The timing diagram of FIG. 8 is similar to the timing diagram illustrated in FIG. 5, except that Vg during T0, T3, T5 may be more negative (for example, as negative as −2 volts) than illustrated in FIG. 5, because transistors sharing a common source line SLk are more likely to be turned off.

In example embodiments illustrated in FIG. 8, the sequence of control signals for a write operation between bit lines BL1~j, source lines SL1~j and word lines WL1~j may be the same as shown in FIG. 5.

As illustrated in the timing diagram of FIG. 8, for data "1", during Ti, Vds is 2 volts and Vg is 0 volts, so according to FIG. 3, a current I3 through bit line BL1~j is caused by the avalanche generation of BJT operation. For data "1", during T2, though Vds is 2 volts and Vg is −2 volts, a current I4 through bit line BL1~j is also caused by the avalanche generation of BJT operation because the body potential may be still remained enough to make forward bias between bit line BL1~j. As shown in FIG. 8, the current I4 through bit line BL1~j, during time period T2 is smaller than I3 because the body potential decreases as a result of the coupling effect of coupling capacitor CC.

As illustrated in the timing diagram of FIG. 8, for data "0", during T1, Vds is 1.5 volts and Vg is 0 volts, so according to FIG. 3, no avalanche generation of BJT operation occurs. As a result, no current flows through bit line BL1~j. Similarly, for data "0", during T2, Vds is 1.5 volts and Vg is −2 volts, so according to FIG. 3, no avalanche generation of BJT operation occurs. As a result, no current flows through bit line BL1~j.

In example embodiments, the word line write voltage may be −1 volts, instead of 0 volts, as shown in both FIGS. 5 and 8.

As illustrated in FIG. 8, although a three-level voltage, −2 volt, −1 volt and 0 volt for the word lines WLi may be used instead of a two-level voltage for the word line WLi, as shown in FIG. 5, a two level voltage, for example, −1 volt and 0 volts like FIG. 5 may also be used.

In example embodiments illustrated in FIG. 8, the sequence of control signals for a read operation between bit lines BL1~j, source lines SL1~j and word lines WL1~j may be the substantially the same as shown in FIG. 5, with the following differences.

As shown in FIG. 8, for a read operation, the row control unit 52 supplies a source line read voltage, for example, 2 volts, to SL1 and continues to supply the source line holding voltage, for example, 0 volts, to all other sources lines SL2-i. The row control unit 52 then supplies a word line read voltage, for example, −1 volts, to WL1 and continues to supply the word line holding voltage, for example, −2 volts, to all other word lines WL2-i.

In example embodiments, a read operation may be performed by supplying only a source line read voltage connected to the memory cell to be read. For a read operation, bit line BL1~j may be electrically floating after pre-charging by the holding voltage and the voltage of BL1~j may be changed according to stored data in memory cell, that is, the column control unit 54 need not supply a holding voltage to the bit lines during a read operation. Also, the above explanation is applicable when a voltage sense amplifier is used as bit line sense amplifier, but not if a current sense amplifier is used.

As shown in FIG. 3, once the voltage across the drain and source $V_{ds}$ reaches 2 volts, when $V_g$ is −1 volt, BJT operation occurs only for a data "1" cell and not for a data "0" cell. That is, a read current I5 created by BJT operation flows for a data "1" cell and a read current I5 does not flow for a data "0" cell (the sensing margin).

As a result, the data can be identified by subsequent sense amplification utilizing, for example, a current sense amplifier or a voltage sense amplifier. Additionally, data "1" and data "0" may be restored by BJT operation and coupling effect, respectively, during a read operation.

In example embodiments illustrated in FIG. 8, the sequence of control signals for a refresh operation between bit lines BL1~j, source lines SL1~j and word lines WL1~j may be substantially the same as the read operation shown in FIG. 5, except that row control unit 52 selects at least two word lines WLi and supplies a word line refresh voltage to the at least two word lines WLi. The word line refresh voltage may be equal to the word line read voltage, and the read current I5 may be same as the refresh current I6. Also, the same explanation for the refresh operation of FIG. 5 may be applied to the refresh operation of FIG. 8.

Figure 9:
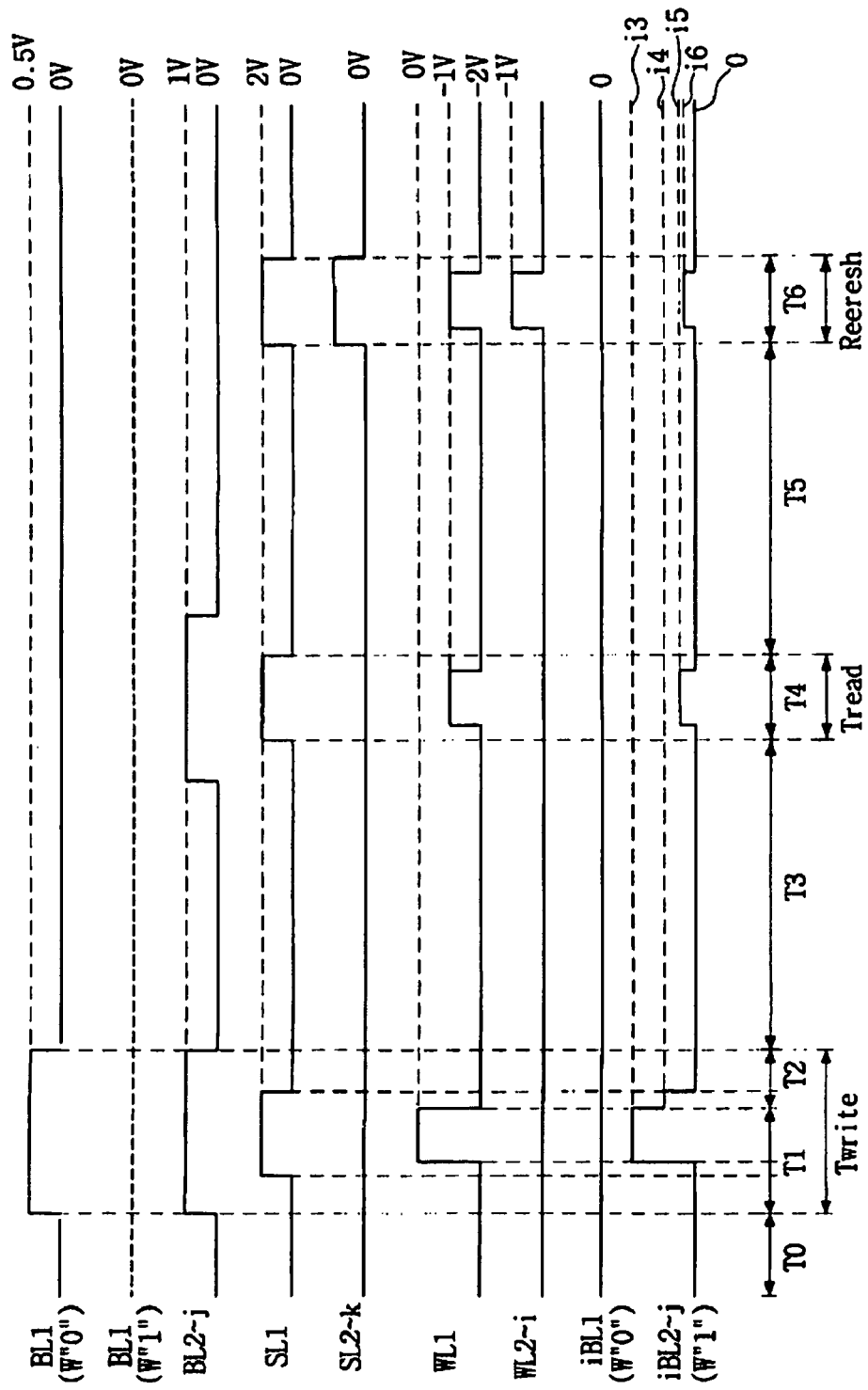
FIG. 9 illustrates a timing diagram for one cell operation in accordance with example embodiments with a common source line architecture.

FIG. 9 illustrates a timing diagram for one cell operation of the memory device of FIG. 7. FIG. 9 illustrates an example timing diagram for a write operation (for writing both a data "1" and a data "0"), a read operation and a refresh operation. In example embodiments discussed below, the refresh operation may be a block refresh operation or a partial refresh operation.

As shown in FIG. 9, a write operation and a read operation is performed for only a memory cell MC1 connected to bit line BL1, SL1 and WL1 and all other MC1 cells connected to SL1 and WL1 are in an inhibit condition. Other than the inhibit condition for both the write operation and a read operation, the description of FIG. 9 is the same as for FIG. 8.

As described above, the difference between FIG. 8 and FIG. 9 is that, in FIG. 9 only a single cell is being written or read, instead of an entire row. As a result, in FIG. 9, the remainder of the cells in the row which are not being written or read are inhibited. In example embodiments, the remainder of the cells in the row are inhibited from being written or read by the application of a bit line write inhibit voltage or a bit line read inhibit voltage, respectively, on bit lines BL2~j.

For a write operation, during T1 and T2, a bit line write inhibit voltage, for example, 1 volt, is applied on bit lines BL2~j. As a result, Vds is 1 volts, and as shown in FIG. 3, BJT operation is prevented and there is no current flow.

Similarly, for a read operation, during T4, a bit line read inhibit voltage, for example, 1 volt, is applied on bit lines BL2~j. As a result, Vds is 1 volt, and as shown in FIG. 3, BJT operation is prevented and there is no current flow. As shown in FIG. 9, with respect to a refresh operation, the refresh operation is the same as FIG. 8.

The timing diagram of FIG. 9 makes it clear that random access operation of a memory cell array 50' is possible.

As illustrated in FIG. 8 and FIG. 9, although a three-level voltage (for example, 0 volts for the word line write voltage, −1 volts for the word line refresh voltage and the word line read voltage, and −2 volts for the word line holding voltage) is shown for the word lines WLi, a two-level voltage (for example, −0 volts for the word line write voltage and −1 volts for the word line holding voltage, the word line read voltage, and the word line refresh voltage for the word line WLi, as shown in FIG. 5), may also be used.

Figure 10:
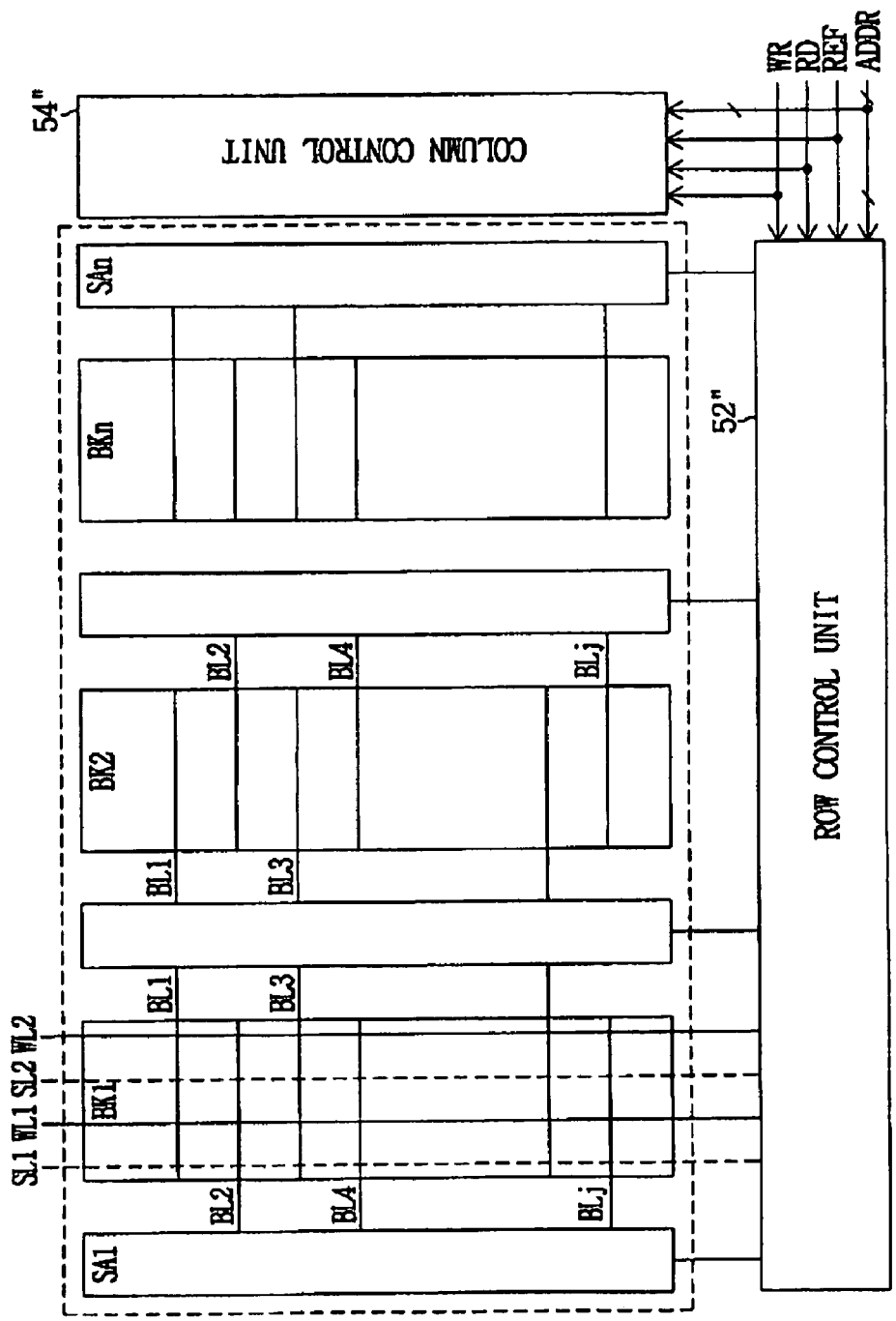
FIG. 10 illustrates an another memory device in which example embodiments may be implemented.

FIG. 10 illustrates a memory device in accordance with example embodiments. FIG. 10 illustrates a memory device including a plurality of memory blocks BK1, BK2, BKn, as well as a row control unit and column control unit. In example embodiments, each memory cell block may be the same as or similar to the memory cell blocks shown in FIGS. 4 and 7. Additionally, as shown in FIG. 10, sense amplifiers SA1-SAn may be provided between memory blocks. In example embodiments, sense amplifiers SA1-SAN may be a voltage sense amplifier or a current sense amplifier.

Also FIG. 10 shows an open bit line structure, however, the teachings of FIG. 10 may also be applied to a folded bit line architecture.

In example embodiments illustrated in FIG. 10, a memory cell array 50' may include a plurality of memory cell blocks such as those illustrated in FIG. 4 or FIG. 7 and may read and write data into and from at least one of the selected memory cell blocks. In example embodiments, the row control unit 52" may select at least one of the memory blocks and a source line SLi and a word line WLi within the selected memory block in response to a write command WR, read command RD, and/or an address command ADD and supply an adequate voltage to select the appropriate SL and WL, respectively.

Also, the row control unit 52" may select at least one of the memory blocks and supply a refresh voltage to at least two source line SLi in the selected memory block in response to a refresh signal REF. Still further, the row control unit 52" may perform a block refresh when it supplies the refresh voltage to all source lines SLi in the selected memory block. Also, all of the memory blocks of the memory device may be refreshed by supplying the refresh voltage to all source lines SLi in each memory block.

In example embodiments, the column control unit 54" controls bit line voltage levels according to data information depending on one row operation or one cell operation. Also, the column control unit 54" may control a refresh operation by supplying a certain voltage to at least one bit line BL. If the certain voltage is applied to all bit lines BLi, all memory cells in the memory cell array 50" may by refreshed. The certain voltage may be same as the refresh voltage supplied to a source line. In example embodiments illustrated in FIG. 10, each sense amplifying block SA1-n may supply data information to a corresponding bit line during a write operation and sense and amplify the data of the memory cell. For one row operation, there may be as many as the number of sense amplifiers SAn. For random access operation, there may be fewer than the number of sense amplifiers SAn.

Figure 11A:
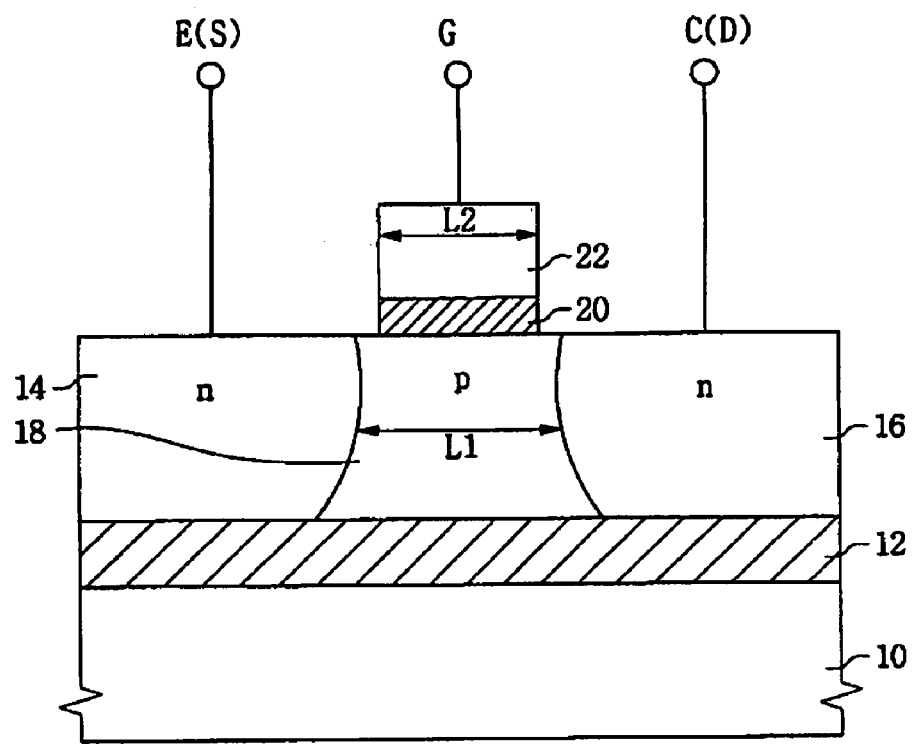
FIGS. 11A-11B illustrate a capacitor-less memory cell structure in accordance with example embodiments.
Figure 11B:
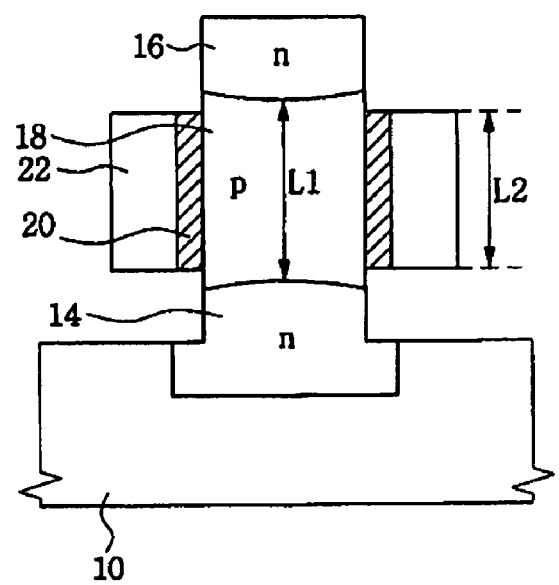

Thus far, BJT operation for a memory device including a capacitor-less memory cell has been explained in accordance with example embodiments. Although the memory cell structures of FIG. 1A and 1B may be used for a memory device as set forth above FIG. 4, FIG. 7 and FIG. 10, additional new memory cell structures for the memory device of FIG. 4, FIG. 7 and FIG. 10 in accordance with example embodiments will be described hereinafter. For the sake of the brevity, like component of a memory cell in the following figures will have like reference numerals FIGS. 11A-11B illustrate a memory cell structure in accordance with example embodiments. As illustrated, a source line may be connected to the collector/drain C/D and a bit line may be connected to the emitter/source E/S. In example embodiments, the first and second nodes 14 and 16 in the silicon layer may be N doped. In example embodiments, the emitter/source E/S may be more heavily doped than collector/drain C/D (for example, N+). In example embodiments, the floating body region 18 may be P-doped. In example embodiments, as illustrated in FIG. 11A, there is no overlap between the gate and the emitter/source E/S and/or the collector/drain C/D. As shown in FIG. 11A, the profile of the boundary between the floating body region 18 and the emitter/source E/S and/or collector/drain C/D may have any shape as long as there is no overlap between the gate and the emitter/source E/S and/or the collector/drain C/D.

As shown in FIG. 3, the sensing margin may be determined by the difference in Vds between a data "1" cell and a data "0" cell. In order to increase the sensing margin, a capacitance of the gate G between gate and floating body relative to the capacitance of drain $C_D$ or capacitance of the source $C_S$ should be reduced.

As a result, there is no overlap between the gate and source and/or drain. Because of the large space between the gate G and the emitter/source E/S and the collector/drain C/D, the non-overlapped memory cell structure may have a slower energy band slope that the memory cell structure of FIG. 1A. As a result, the maximum E-field may be reduced and/or a recombination rate may also be reduced, as compared with the memory cell structure of FIG. 1A. Due to these characteristics, a non-overlapped memory cell structure of FIG. 11A shows better retention time and/or better leakage characteristics.

Additionally, a gate induced drainage leakage (GIDL) phenomenon that may degrade data "0" may be reduced because the capacitance between the gate and drain $C_{gd}$ becomes smaller.

Additionally, the reduced capacitance of the gate $C_g$ may be compensated for by making insulating layer 20 thinner to secure a coupling capacitance between the gate and the floating body 18. In example embodiments, the gate length L2 is smaller than the floating body length L1. Such parameters may improve scalability.

Though not shown in FIG. 11A, the gate may overlap only one of the first node 14 and the second node 16. For example, the gate may overlap only the one of the first node 14 and the second node 16 that receives a higher applied voltage during the bipolar junction operation.

The sensing margin may depend on the charge difference stored in floating body between data "1" cell and a data "0" cell. Because the data "1" cell has more charge than a data "0" cell and thus the body potential of a data "1" is higher than that of a data "0" cell, BJT operation occurs for a data "1" cell faster than in a data "0" cell. This can be shown by FIG. 3 wherein the data "1" cell is to the left of the data "0" cell for all $V_g$.

As a result, if more charge can be stored in the floating body for a data "1" cell during a write operation, a better sensing margin will be achieved.

Still further, runaway or a mean free path for electrons between the base and collector may be longer than that of FIG. 1A. As a result, impact ionization for avalanche generation may occur more easily. As a result, more charge may be stored into the floating body for data "1" cell. In example embodiments, the impurity concentration of the emitter/source E/S may be greater than that of the collector/drain C/D. In addition, accumulated holes by the BJT operation may be held near the gate G due to the negative hold word line voltage, as set forth in example embodiments. As shown in FIG. 11A, if the floating body region 18 near the gate G may be wider than at least one other portion of the floating body region 18, retention time may be improved.

FIG. 11B illustrates a vertical memory cell structure in accordance with example embodiments. As illustrated in FIG. 11B, a vertical capacitor-less memory cell may include a substrate 10, a first node 14, a floating body region 18, and a second node 16 vertically stacked on the substrate 10. The floating body region 18 is floating electrically. As shown in FIG. 11B, the floating body region 18 may have a floating body length L1.

The gate insulating layer 20 and gate 22 may surround the floating body 18. For example, the gate insulating layer 20 and gate 22 may contact all or a portion of two or more sides of the floating body 18. If the vertical capacitor-less memory cell is an NMOS transistor, the first and the second node 14 and 16 may be of a first conductivity type, for example, N conductivity type, and the floating body region 18 may be of a second conductivity type, for example, P conductivity type. Also, a vertical capacitor structure may have an SOI substrate or a conventional bulk substrate as shown in FIG. 11B.

As illustrated, a source line may be connected to the collector/drain C/D and a bit line may be connected to the emitter/source E/S. In example embodiments, as illustrated in FIG. 11B, there is no overlap between the gate electrode and the emitter/source E/S and/or the collector/drain C/D. Other features described above with respect to FIG. 11A may also be present in the vertical structure of FIG. 11B.

Figure 12A:
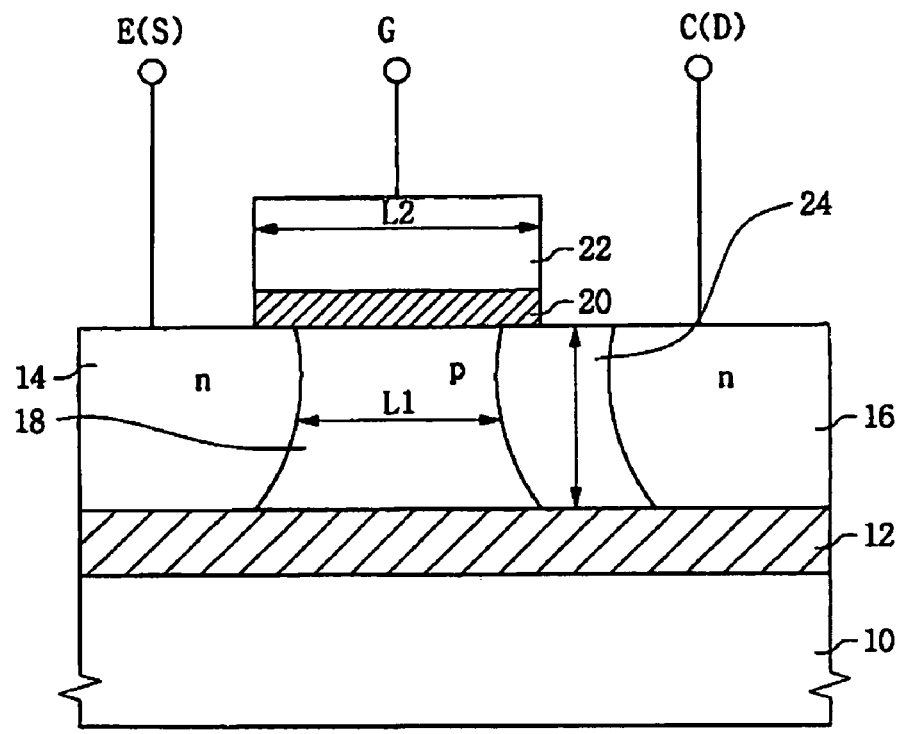
FIGS. 12A and 12B illustrate capacitor-less memory cell structures in accordance with example embodiments.
Figure 12B:
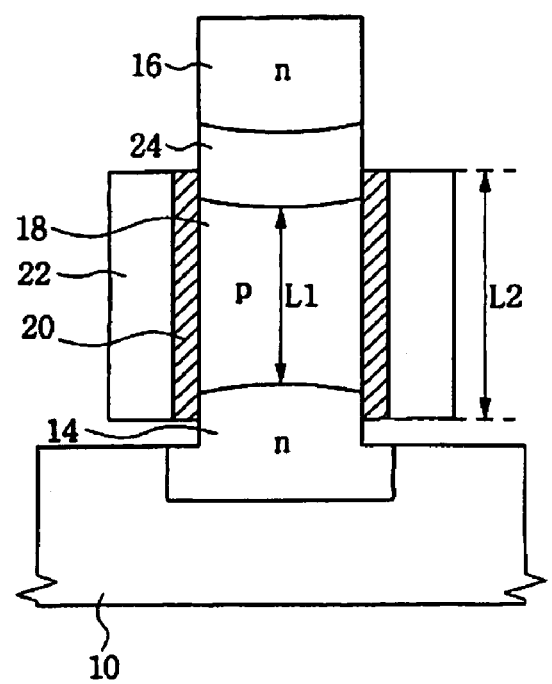

FIGS. 12A and 12B illustrate cell structures in accordance with example embodiments. As shown in FIGS. 12A-12B, in order to improve multiplication and avalanche generation, a buffer region 24 may be formed between the floating body and the collector/drain. In example embodiments, a buffer region 24 is not provided between the floating body and the emitter/source. In example embodiments, the impurity concentration of the buffer region 24 may be lower than that of the collector/drain and/or of the floating body. In example embodiments, an intrinsic semiconductor may be used as the buffer region 24. In example embodiments, the buffer region 24 may be one of N-, N, or P-. In example embodiments, the buffer region 24 has a height the same as the node 16 to which it is nearest. In example embodiments, the buffer region 24 covers the entire boundary of the node 16 to which it is nearest. In example embodiments, the buffer region 24 contacts the insulating layer 12.

In example embodiments, the buffer region 24 increases the mean free path or runaway for electrons from the base to the collector/drain. By increasing the runaway path, impact ionization for avalanche generation may be improved. As a result, more charge may be stored in a data "1" cell.

In example embodiments, the impurity concentration of the emitter/source may be greater than that of the collector/drain. In example embodiments, if the buffer region 24 is of N-, L2 may be greater than L1, whereas if the buffer region 24 is of P-, L2 may be less than L1.

As shown in FIG. 12B, a vertical cell structure may also be implemented without increasing layout area for the buffer region, because as shown in FIG. 12B, the buffer region 24 extends in a vertical direction.

FIG. 12B illustrates a vertical memory cell structure in accordance with example embodiments. As illustrated in FIG. 12B, a vertical capacitor-less memory cell may include a substrate 10, a first node 14, a floating body region 18, a buffer region 24, and a second node 16 vertically stacked on the substrate 10. The floating body region 18 is floating electrically. As shown in FIG. 12B, the floating body region 18 may have a floating body length L1.

The gate insulating layer 20 and gate 22 may surround the floating body 18. For example, the gate insulating layer 20 and gate 22 may contact all or a portion of two or more sides of the floating body 18. If the vertical capacitor-less memory cell is an NMOS transistor, the first and the second node 14 and 16 may be of a first conductivity type, for example, N conductivity type, and the floating body region 18 may be of a second conductivity type, for example, P conductivity type. Also, a vertical capacitor structure may have an SOI substrate or a conventional bulk substrate as shown in FIG. 12B.

As illustrated, in order to improve multiplication and avalanche generation, a buffer region 24 may be formed between the floating body and the collector/drain. In example embodiments, a buffer region 24 is not provided between the floating body and the emitter/source. In example embodiments, the impurity concentration of the buffer region 24 may be lower than that of the collector/drain and/or of the floating body. In example embodiments, an intrinsic semiconductor may be used as the buffer region 24. In example embodiments, the buffer region 24 may be one of N-, N, or P-. In example embodiments, the buffer region 24 has a height the same as the node 16 to which it is nearest. In example embodiments, the buffer region 24 covers the entire boundary of the node 16 to which it is nearest. In example embodiments, the buffer region 24 contacts the insulating layer 12.

As shown in FIG. 12A and 12B, the profile of the boundary between the floating body region 18, the emitter/source E/S, the collector/drain C/D, and/or the buffer region 24 may have any shape.

Other features described above with respect to FIG. 12A may also be present in the vertical structure of FIG. 12B.

In example embodiments, a vertical structure may have an SOI substrate, or a conventional substrate as shown in FIG. 12B.

Figure 13A:
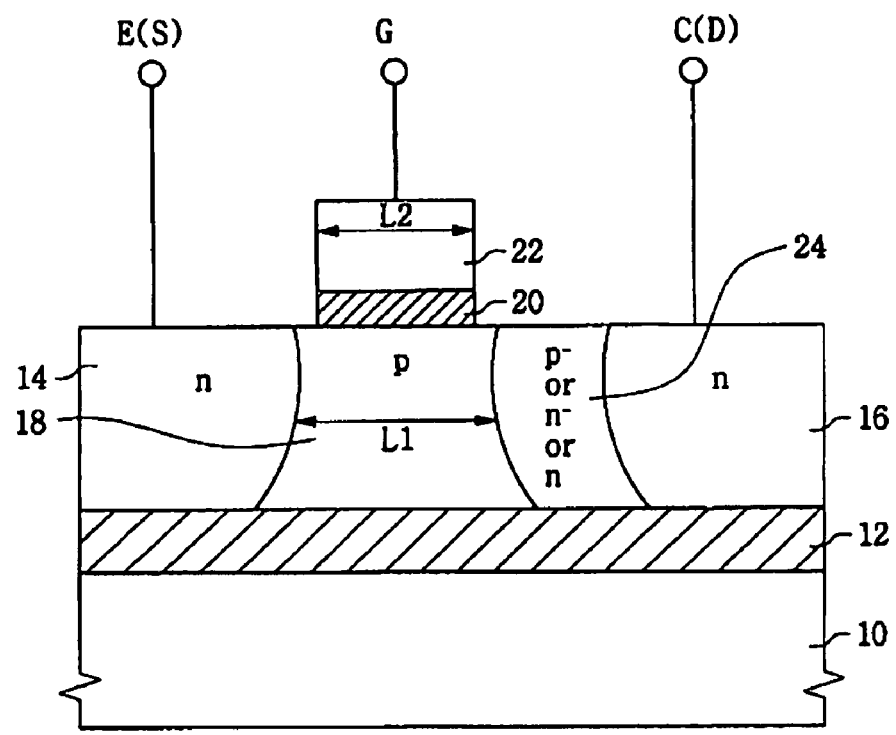
FIGS. 13A-13B illustrate capacitor-less memory cell structures in accordance with example embodiments.
Figure 13B:
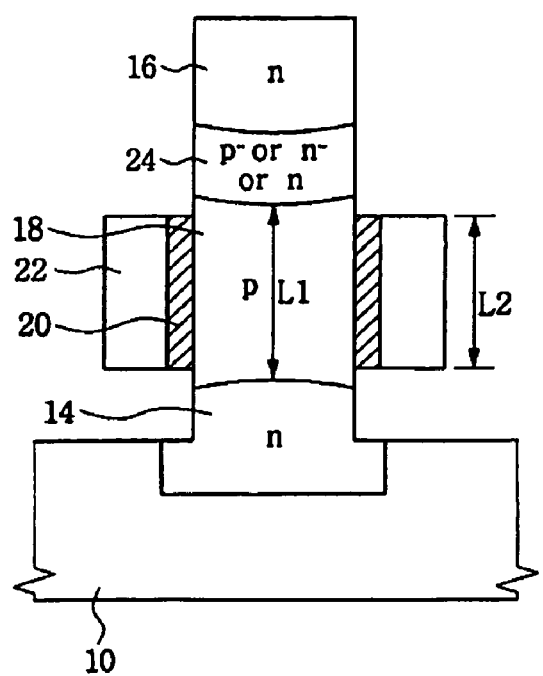

FIGS. 13A-13B illustrate memory cell structures in accordance with example embodiments. As shown, FIGS. 13A and 13B illustrate a combination of features shown in FIGS. 11 and 12A-12B. In example embodiments shown in FIGS. 13A-13B, L1 is greater than L2 even when buffer region 24 is N-. As discussed above, with respect to FIGS. 11A-11B, example embodiments illustrated in FIGS. 13A-13B may reduce GIDL and/or increase the mean free path.

As illustrated, a source line may be connected to the collector/drain C/D and a bit line may be connected to the emitter/source E/S. In example embodiments, as illustrated in FIG. 13A, there is no overlap between the gate electrode and the emitter/collector E/C. As shown in FIG. 3, the sensing margin may be determined by the difference in Vds between a data "1" cell and a data "0" cell. In order to increase the sensing margin, capacitance of the gate C/G relative to the capacitance of drain C/D or capacitance of the source C/S should be reduced.

As a result, there is no overlap between the gate and source or drain. Additionally, a gate induced drainage leakage (GIDL) phenomenon that may degrade data "0" may be reduced because the capacitance across the gate and drain $C_{gd}$ becomes smaller.

Additionally, the reduced capacitance of the gate $C_g$ may be compensated for by making insulating layer 20 thinner to secure a coupling capacitance between the gate and body. In example embodiments, the gate length L2 is smaller than the floating body length L1. Such parameters may improve scalability.

The sensing margin may depend on the charge difference stored in floating body between data "1" cell and a data "0" cell. Because the data "1" cell has much more charge than a data "0" cell and thus the body potential of a data "1" is higher than that of a data "0" cell, BJT operation occurs for a data "1" cell faster than in a data "0" cell. This can be shown by FIG. 3 wherein the data "1" cell is to the left of the data "0" cell.

As a result, if more charge can be stored in the floating body for a data "1" cell during a write operation, a better sensing margin will be achieved.

Still further, runaway or a mean free path for electrons between the base and collector may be longer than that of FIG. 1A. As a result, impact ionization for avalanche generation may occur more quickly. As a result, more charge may be stored in a data "1" cell. In example embodiments, the impurity concentration of the emitter/source may be greater than that of the collector/drain.

As shown in FIGS. 13A-13B, in order to improve multiplication and avalanche generation, a buffer region 24 may be formed between the floating body and the collector/drain. In example embodiments, a buffer region 24 is not provided between the floating body and the emitter/source. In example embodiments, the impurity concentration of the buffer region 24 may be lower than that of the collector/drain and/or of the floating body. In example embodiments, an intrinsic semiconductor may be used as the buffer region 24. In example embodiments, the buffer region 24 may be one of N-, N, or P-. In example embodiments, the buffer region 24 has a height the same as the node 16 to which it is nearest. In example embodiments, the buffer region 24 covers the entire boundary of the node 16 to which it is nearest. In example embodiments, the buffer region 24 contacts the insulating layer 12.

In example embodiments, the buffer region 24 increases the mean free path or runaway for electrons from the base to the collector/drain. By increasing the runaway path, impact ionization for avalanche generation may be improved. As a result, more charge may be stored in a data "1" cell.

In example embodiments, the impurity concentration of the emitter/source may be greater than that of the collector/drain.

As shown in FIG. 13B, a vertical cell structure may also be implemented without increasing layout area for the buffer region 24, because as shown in FIG. 13B, the buffer region 24 extends in a vertical direction.

As shown in FIG. 13A and 13B, the profile of the boundary between the floating body region 18, the emitter/source E/S, the collector/drain C/D, and/or the buffer region 24 may have any shape.

In example embodiments, a vertical structure may have an SOI substrate or a conventional substrate as shown in FIG. 13B.

Figure 14A:
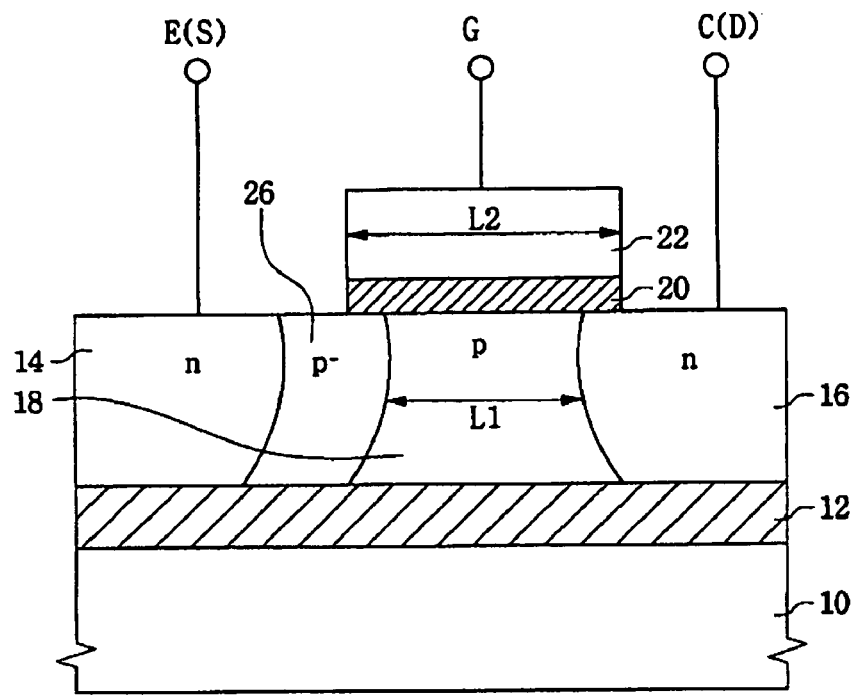
FIGS. 14A-14B illustrate capacitor-less memory cell structures in accordance with example embodiments.
Figure 14B:
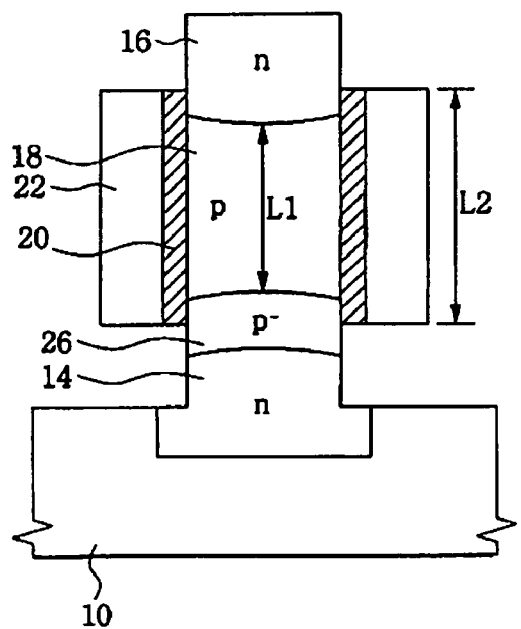

FIGS. 14A-14B illustrate memory cell structures in accordance with example embodiments. As illustrated in FIGS.

14A-14B, an auxiliary body region 26 is provided to increase the electron injection efficiency from the emitter to the floating body 18. In example embodiments, an impurity concentration of the auxiliary body region 26 may be smaller than that of the floating body region 18. In example embodiments, the floating body region 18 is longer than the auxiliary body region 26. In example embodiments, the auxiliary body region 26 contacts the emitter/source E/S.

In example embodiments, the auxiliary body region 26 helps more electrons to be injected to the floating body region 18 and get to the base/collector region and thus more effective BJT operation may occur. In example embodiments, the impurity concentration of the emitter is higher than that of the collector and/or that of the base.

As shown in FIG. 14B, a vertical cell structure may also be implemented without increasing layout area for the auxiliary body region 26, because as shown in FIG. 14B, the auxiliary body region 26 extends in a vertical direction.

As shown in FIG. 14A and 14B, the profile of the boundary between the floating body region 18, the emitter/source E/S, the collector/drain C/D, and/or the auxiliary body region 26 may have any shape.

In example embodiments, a vertical structure may have an SOI substrate or a conventional substrate as shown in FIG. 14B.

Figure 15A:
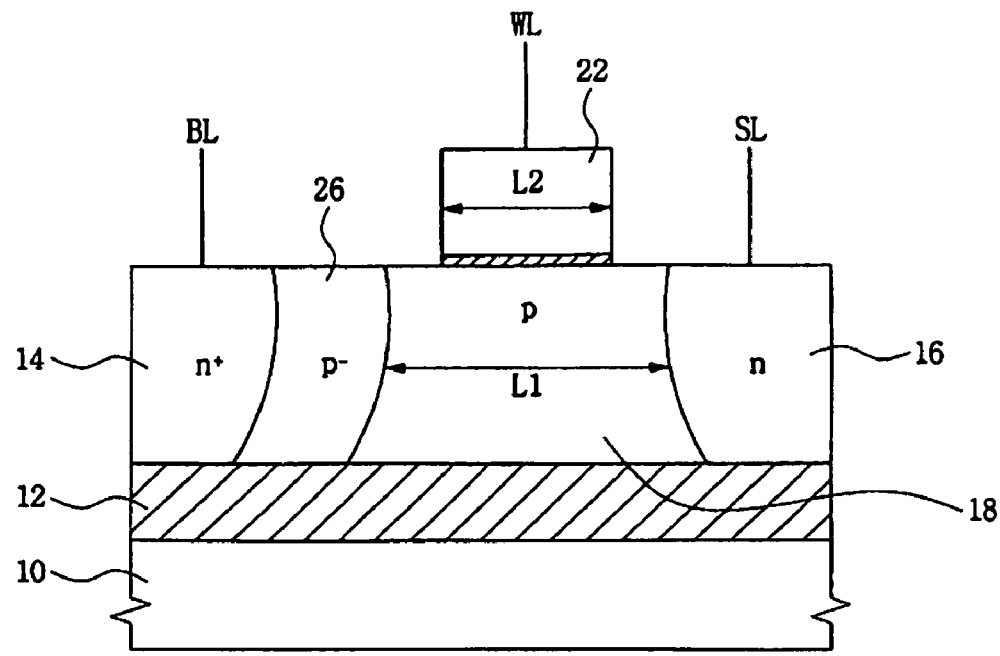
FIGS. 15A-15C illustrate capacitor-less memory cell structures in accordance with example embodiments.
Figure 15B:
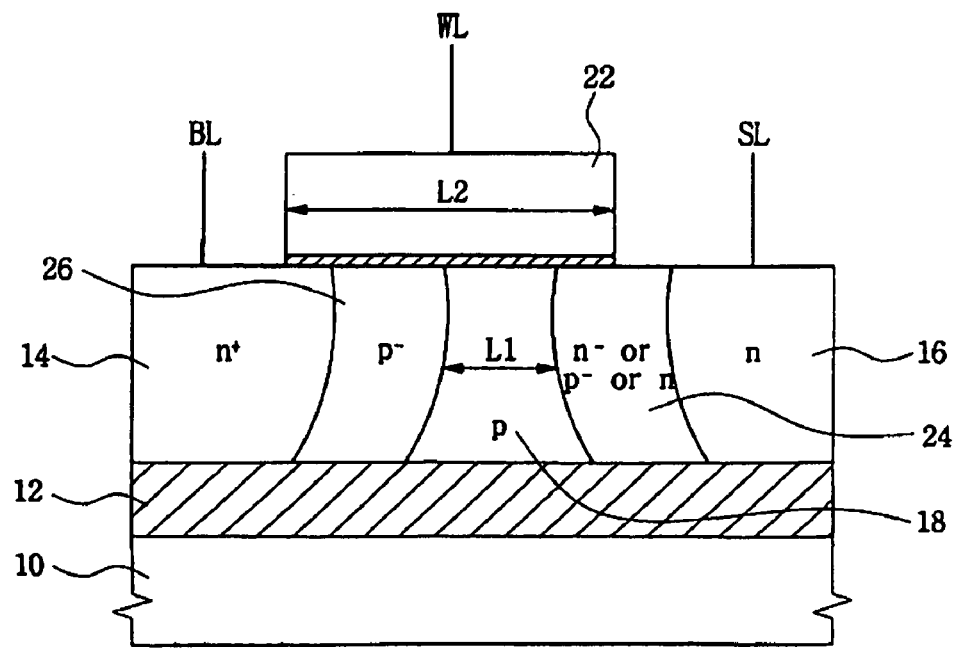
Figure 15C:
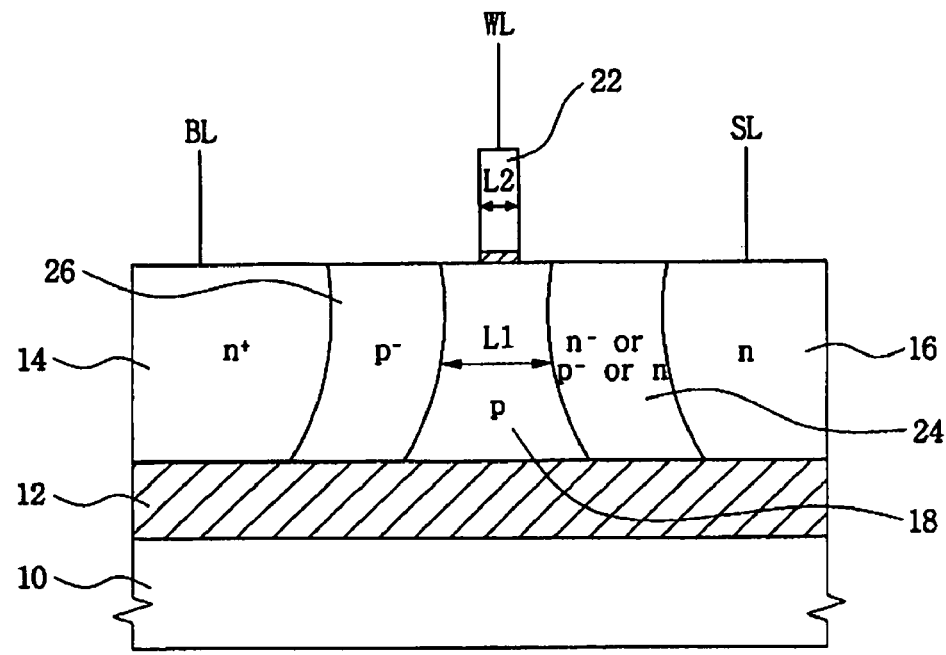

FIG. 15A-15C illustrates other example combinations of the features of FIGS. 11-14B. As shown, FIG. 15A illustrates a combination of features shown in FIGS. 11A and 14A. In particular, FIG. 15A illustrates a gate 22 and a floating body region 18, where L1>L2 and an auxiliary body region 26 is provided to increase the electron injection efficiency from the emitter/source E/S.

As illustrated, a source line SL may be connected to the collector/drain C/D and a bit line BL may be connected to the emitter/source E/S. In example embodiments, as illustrated in FIG. 11A, there is no overlap between the gate 22 and the emitter/source E/S and/or the collector/drain C/D. As shown in FIG. 3, the sensing margin may be determined by the difference in Vds between a data "1" cell and a data "0" cell. In order to increase the sensing margin, capacitance of the gate $C_G$ relative to the capacitance of the collector/drain C/D (for example, drain $C_D$) or capacitance of the emitter/source E/S (for example, source $C_S$) should be reduced.

As a result, there is no overlap between the gate 22 and the emitter/source E/S and/or the collector/drain C/D. Additionally, a gate induced drainage leakage (GIDL) phenomenon that may degrade data "0" may be reduced because the capacitance across the gate 22 and drain $C_{gd}$ becomes smaller.

Additionally, the reduced capacitance of the gate $C_g$ may be compensated for by making insulating layer 20 thinner to secure a coupling capacitance between the gate 22 and the floating body region 18. In example embodiments, the gate length L2 is smaller than the floating body length L1. Such parameters may improve scalability.

The sensing margin may depend on the charge difference stored in floating body between data "1" cell and a data "0" cell. Because the data "1" cell has much more charge than a data "0" cell and thus the body potential of a data "1" is higher than that of a data "0" cell, BJT operation occurs for a data "1" cell faster than in a data "0" cell. This can be shown by FIG. 3 wherein the data "1" cell is to the left of the data "0" cell.

As a result, if more charge can be stored in the floating body region 18 for a data "1" cell during a write operation, a better sensing margin will be achieved.

Still further, runaway or a mean free path for electrons between the base B and collector/drain C/D may be longer than that of FIG. 1A. As a result, impact ionization for avalanche generation may occur more quickly. As a result, more charge may be stored in a data "1" cell. In example embodiments, the impurity concentration of the emitter/source E/S may be greater than that of the collector/drain C/D.

In example embodiments, an impurity concentration of the auxiliary body region 26 may be smaller than that of the floating body region 18. In example embodiments, the floating body region 18 is longer than the auxiliary body region 26. In example embodiments, the auxiliary body region 26 contacts the emitter/source E/S.

In example embodiments, the auxiliary body region 26 helps more electrons to be injected to the floating body region 18 and get to the base B/ collector/drain C/D region and thus more effective BJT operation may occur. In example embodiments, the impurity concentration of the emitter/source E/S is higher than that of the collector/drain C/D and/or that of the base B.

A vertical cell structure may also be implemented without increasing layout area for the auxiliary body region 26, because as shown in FIG. 14B, the auxiliary body region 26 extends in a vertical direction.

In example embodiments, a vertical structure may also have the features of FIG. 15A. In example embodiments, the vertical structure may have an SOI substrate, as shown in FIG. 15A or a conventional substrate.

FIG. 15B illustrates a combination of features shown in FIGS. 12A and 14A. As shown in FIG. 15B, in order to improve multiplication and avalanche generation, a buffer region 24 may be formed between the floating body region 18 and the collector/drain C/D. In example embodiments, a buffer region 24 is not provided between the floating body region 18 and the emitter/source E/S. In example embodiments, the impurity concentration of the buffer region 24 may be lower than that of the collector/drain C/D and/or of the floating body region 18. In example embodiments, an intrinsic semiconductor may be used as the buffer region 24. In example embodiments, the buffer region 24 may be one of N-, N, or P-. In example embodiments, the buffer region 24 has a height the same as the node 16 to which it is nearest. In example embodiments, the buffer region 24 covers the entire boundary of the node 16 to which it is nearest. In example embodiments, the buffer region 24 contacts the insulating layer 12.

In example embodiments, the buffer region 24 increases the mean free path or runaway for electrons from the base B to the collector/drain C/D. By increasing the runaway path, impact ionization for avalanche generation may be improved. As a result, more charge may be stored in a data "1" cell.

In example embodiments, the impurity concentration of the emitter/source E/S may be greater than that of the collector/drain C/D. In example embodiments, if the buffer region 24 is of N-, L2 may be greater than L1, whereas if the buffer region 24 is of P-, L2 may be less than L1.

As illustrated in FIGS. 15B, an auxiliary body region 26 is provided to increase the electron injection efficiency from the emitter/source E/S. In example embodiments, an impurity concentration of the auxiliary body region 26 may be smaller than that of the floating body region 18. In example embodiments, the floating body region 18 is longer than the auxiliary body region 26. In example embodiments, the auxiliary body region 26 contacts the emitter/source E/S.

In example embodiments, the auxiliary body region 26 helps more electrons to be injected to the floating body region 18 and get to the base B/collector/drain C/D region and thus more effective BJT operation may occur. In example embodiments, the impurity concentration of the emitter/source E/S is higher than that of the collector/drain C/D and/or that of the base B.

A vertical cell structure may also be implemented without increasing layout area for the buffer region 24 and the auxiliary body region 26, because as shown in FIGS. 13B and 14B, the buffer region 24 and the auxiliary body region 26 extend in a vertical direction.

In example embodiments, a vertical structure may also have the features of FIG. 15B. In example embodiments, the vertical structure may have an SOI substrate, as shown in FIG. 15B or a conventional substrate.

FIG. 15C illustrates a combination of features shown in FIGS. 11A, 12A and 14A. As shown in FIG. 15C, a source line SL may be connected to the collector/drain C/D and a bit line BL may be connected to the emitter/source E/S. In example embodiments, as illustrated in FIG. 11A, there is no overlap between the gate 22 and the emitter/source E/S and/or the collector/drain C/D. As shown in FIG. 3, the sensing margin may be determined by the difference in Vds between a data "1" cell and a data "0" cell. In order to increase the sensing margin, capacitance of the gate $C_G$ relative to the capacitance of drain $C_D$ or capacitance of the source $C_S$ should be reduced.

As a result, there is no overlap between the gate 22 and emitter/source E/S and/or collector/drain C/D. Additionally, a gate induced drainage leakage (GIDL) phenomenon that may degrade data "0" may be reduced because the capacitance across the gate and drain $C_{gd}$ becomes smaller.

Additionally, the reduced capacitance of the gate $C_g$ may be compensated for by making insulating layer 20 thinner to secure a coupling capacitance between the gate 22 and the floating body region 18. In example embodiments, the gate length L2 is smaller than the floating body length L1. Such parameters may improve scalability.

The sensing margin may depend on the charge difference stored in floating body between data "1" cell and a data "0" cell. Because the data "1" cell has much more charge than a data "0" cell and thus the body potential of a data "1" is higher than that of a data "0" cell, BJT operation occurs for a data "1" cell faster than in a data "0" cell. This can be shown by FIG. 3 wherein the data "1" cell is to the left of the data "0" cell.

As a result, if more charge can be stored in the floating body for a data "1" cell during a write operation, a better sensing margin will be achieved.

Still further, runaway or a mean free path for electrons between the base and collector may be longer than that of FIG. 1A. As a result, impact ionization for avalanche generation may occur more quickly. As a result, more charge may be stored in a data "1" cell. In example embodiments, the impurity concentration of the emitter/source E/S may be greater than that of the collector/drain C/D.

As shown in FIG. 15C, in order to improve multiplication and avalanche generation, a buffer region 24 may be formed between the floating body region 18 and the collector/drain C/D. In example embodiments, a buffer region 24 is not provided between the floating body region 18 and the emitter/source E/S. In example embodiments, the impurity concentration of the buffer region 24 may be lower than that of the collector/drain C/D and/or of the floating body region 28. In example embodiments, an intrinsic semiconductor may be used as the buffer region 24. In example embodiments, the buffer region 24 may be one of N-, N, or P-. In example embodiments, the buffer region 24 has a height the same as the node 16 to which it is nearest. In example embodiments, the buffer region 24 covers the entire boundary of the node 16 to which it is nearest. In example embodiments, the buffer region 24 contacts the insulating layer 12.

In example embodiments, the buffer region 24 increases the mean free path or runaway for electrons from the base B to the collector/drain C/D. By increasing the runaway path, impact ionization for avalanche generation may be improved. As a result, more charge may be stored in a data "1" cell.

In example embodiments, the impurity concentration of the emitter/source E/S may be greater than that of the collector/drain C/D.

As illustrated in FIGS. 15C, an auxiliary body region 26 is provided to increase the electron injection efficiency from the emitter/source E/S. In example embodiments, an impurity concentration of the auxiliary body region 26 may be smaller than that of the floating body region 18. In example embodiments, the floating body region 18 is longer than the auxiliary body region 26. In example embodiments, the auxiliary body region 26 contacts the emitter/source E/S.

In example embodiments, the auxiliary body region 26 helps more electrons to be injected to the floating body region 18 and get to the base B/collector/drain C/D region and thus more effective BJT operation may occur. In example embodiments, the impurity concentration of the emitter/source E/S is higher than that of the collector/drain C/D and/or that of the base B.

A vertical cell structure may also be implemented without increasing layout area for the buffer region 24 and the auxiliary body region 26, because as shown in FIGS. 13B and 14B, the buffer region 24 and the auxiliary body region 26 extend in a vertical direction.

As shown in FIG. 11A and 14B, the profile of the boundary between any regions may have any shape.

In example embodiments, a vertical structure may also have the features of FIG. 15C. In example embodiments, the vertical structure may have an SOI substrate, as shown in FIG. 15C or a conventional substrate.

Figure 16A:
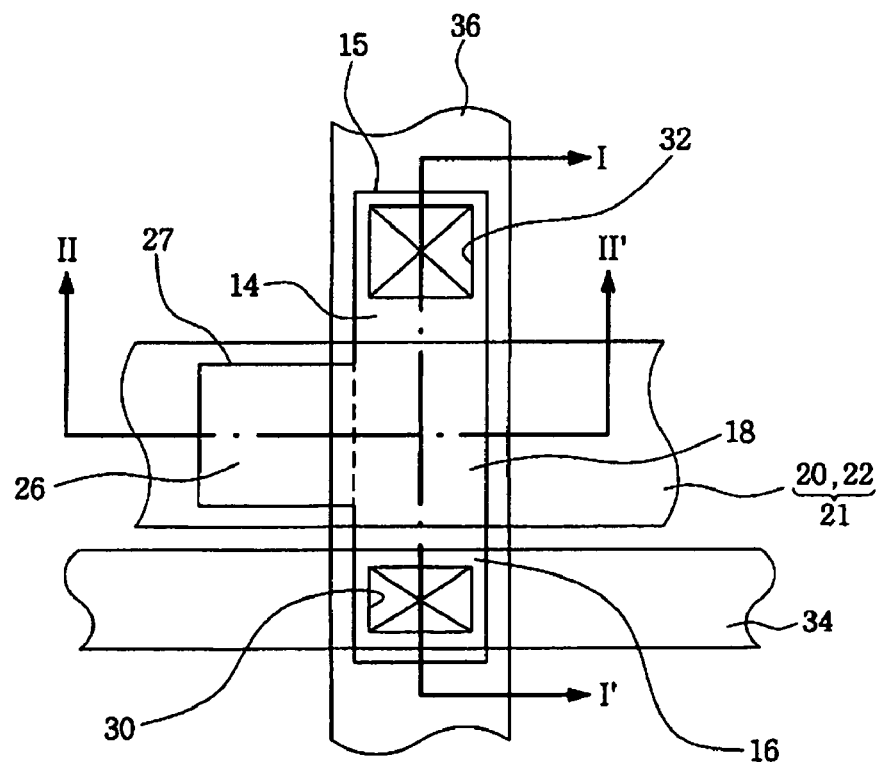
FIG. 16A illustrates a plan view of a memory cell structure in accordance with example embodiments.

FIG. 16A illustrates a plan view of a memory cell structure in accordance with example embodiments. As shown in FIG. 16A, a memory cell structure may include a first node 14 (for example, an emitter/source E/S), a second node 16 (for example, a collector/drain C/D), a floating body region 18, a word line 21, an extended body region 27, a first contact 30, a second contact 32, a source line 34, and/or a bit line 36. In example embodiments, the extended body region 27 may be under the word line 21 and extend from one side of the floating body region 18 to serve as an additional charge storage region. In example embodiments, the extended body region 27 may improve a charge retention ability of a capacitor-less memory.

Figure 16B:
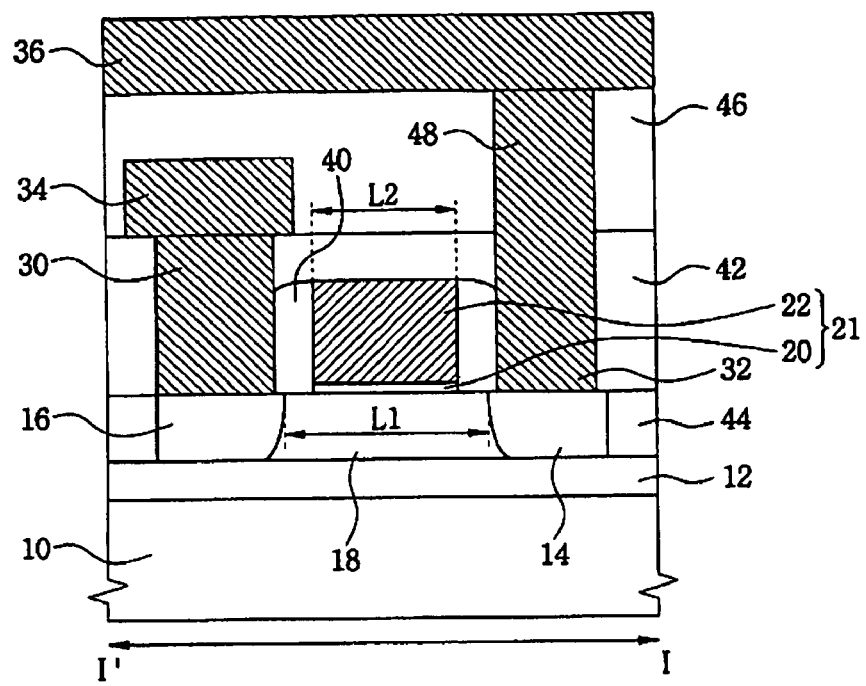
FIG. 16B illustrates a cross-sectional view of direction I-I' of FIG. 16A.

FIG. 16B illustrates a cross-sectional view of direction I-I' of FIG. 16A. As shown in FIG. 16B, a memory cell structure may include a substrate 10, an insulating layer 12, a first node 14 (for example, an emitter/source E/S), a second node 16 (for example, a collector/drain C/D), and a floating body region 18. The memory cell may further include isolation layers 44, adjacent to the first node 14 and the second node 16. The memory cell may further include a first contact 30 and source line 34, a second contact 48 and bit line 36, a gate 21 including a gate insulating layer 20 and a gate layer 22, and insulating layers 42 and 46. As shown in FIG. 16B, $L_1 > L_2$. The extended body region 27 is not visible in FIG. 16B.

Figure 16C:
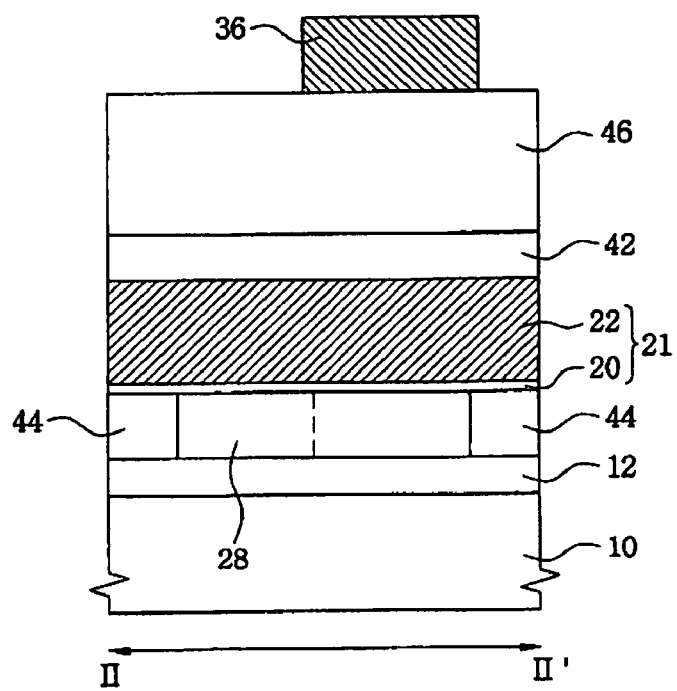
FIG. 16C illustrates a cross-sectional view along direction II-II' shown in FIG. 16A.

FIG. 16C illustrates a cross-sectional view along direction II-II' shown in FIG. 16A. FIG. 16C illustrates the substrate 10, the insulating layer 12, the floating body region 18, the extended body region 27, isolation layers 44, the gate 21, insulating layers 42 and 46, and the bit line 36. The extended body region 27 is shown in FIG. 16C as an extension of the floating body region 18.

It is noted that the extended body region 27 of FIGS. 16A-16C may be utilized in combination with any or all of the features set forth above in FIGS. 11-15C.

Figure 17:
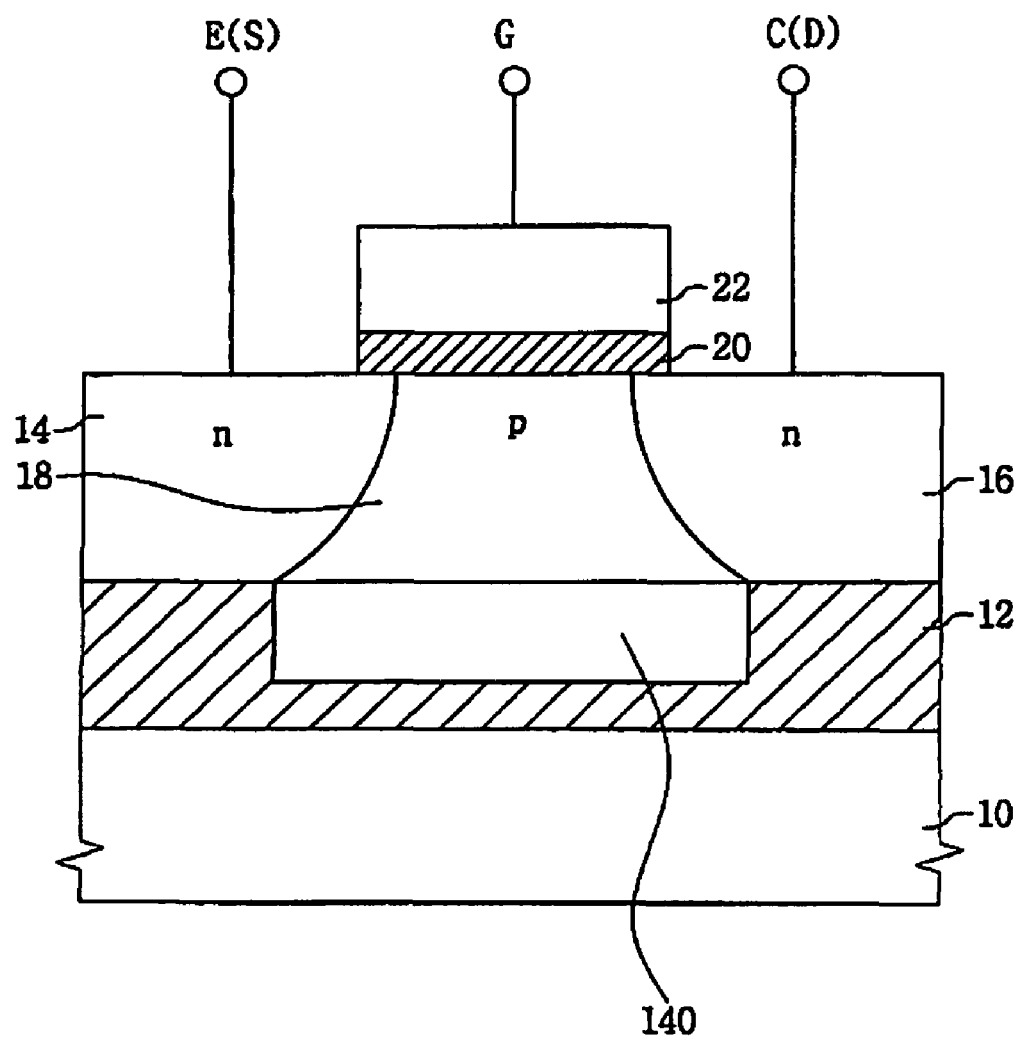
FIG. 17 illustrates a cross-sectional view of a capacitor-less memory according to example embodiments.

Additionally, a hole reservoir 140 may be formed below the floating body region 18, as shown in FIG. 17. The hole reservoir 140 may be buried in the insulating layer 12. The hole reservoir 140 may include a semiconductor material or a metal material which may have a higher valence band than that of Si. For example, the hole reservoir 140 may include any one of Ge, Si—Ge, Al—Sb, and Ga—Sb. Because the valence band of the hole reservoir 140 is higher than that of Si, holes may more easily be accumulated in the hole reservoir 140. The hole reservoir 140 may be separated from the emitter/source E/S and the collector/drain C/D, and thus data retention properties may be improved by reducing the junction leakage current. Therefore, the capacitor-less memory according to example embodiments may have improved data retention properties. Additional details regarding hole reservoirs may be found U.S. Ser. No. 12/005,399, entitled "CAPACITOR-LESS DRAM AND METHODS OF MANUFACTURING THE SAME" filed on Dec. 27, 2007, the entire contents of which are hereby incorporated by reference in their entirety.

Also conventional CMOS technology based on bulk silicon substrate has shown a fatal short channel effect with a gate channel length less that about 40 nm. Due to the limitation of conventional MOS devices, active research has been conducted in the area of FinFET devices.

Figure 18:
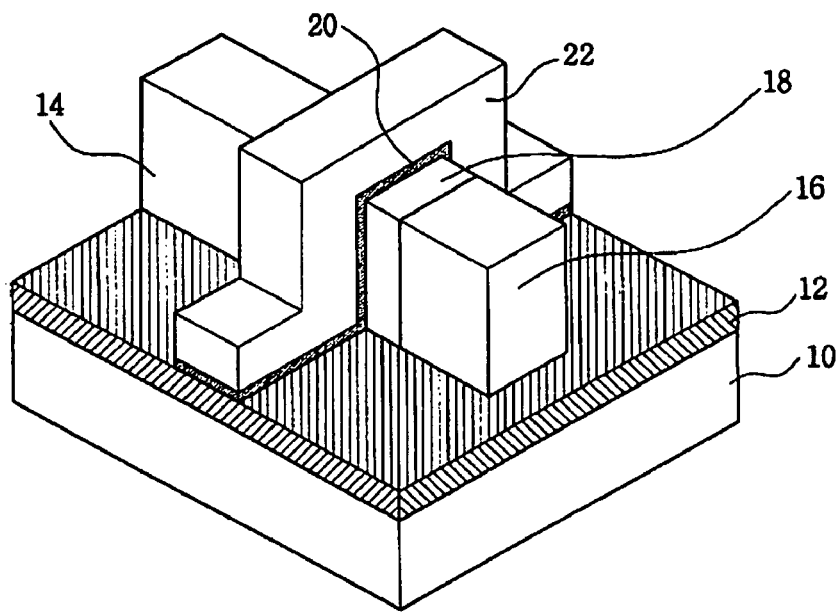
FIG. 18 illustrates a capacitor-less memory with a FinFET structure according to example embodiments.

FIG. 18 shows a memory cell structure in accordance with example embodiment. The FinFET memory cell shown in FIG. 18 is fabricated on an insulating layer 12 on a substrate 10. The FinFET memory cell includes a silicon pattern on the insulating layer 12 having a first node 14, a second node 16 and/or a floating body region 18. The FinFET memory cell further includes a gate insulating layer 20 and gate 22. The gate 22 surrounds the floating body 18. For example, the gate insulating layer 20 and gate 22 may contact all or a portion of two or more sides of the floating body 18. As shown in FIG. 18, the gate insulating layer 20 and gate 22 contact a portion of three sides of the floating body 18.

In example embodiments, as illustrated in FIG. 18, there is no overlap between the gate 22 and the first node 14 or the second node 16. That is, the gate length is smaller than the floating body length, for example, as shown in FIG. 11A. However, in alternate embodiments, the gate 22 may overlap one or both of the first node 14 and the second node 16.

In the same manner, a buffer region 24 and/or an auxiliary body region 26 set forth above in example embodiments may be utilized in combination with the FinFET memory device of FIG. 18.

Figure 19:
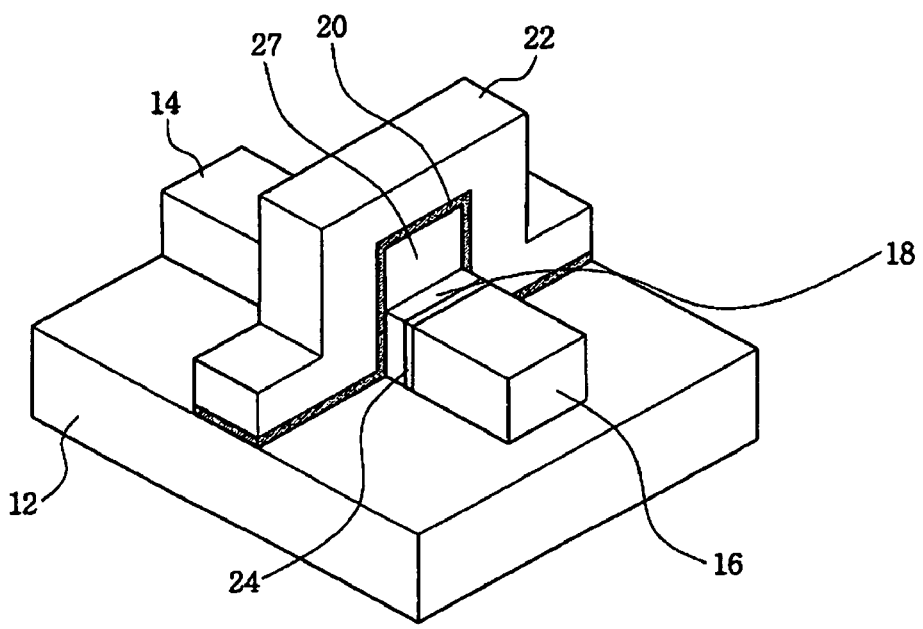
FIG. 19 illustrates another capacitor-less memory using a FinFET structure according to example embodiments.

FIG. 19 shows a memory cell structure in accordance with example embodiments. The memory cell structure shown in FIG. 19 has the same structure as that of FIG. 18, except that it may includes an extended body region 27 on the floating body region 18 and under the gate structure 20 and 22. The gate structure 20 and 22 surrounds the floating body region and the extended body region 27. The extended body region 27 which serves as additional charge storage region 27 may improve a charge retention ability of the memory device. In example embodiments, as shown in FIG. 18, the memory device may also include a buffer region 24 and/or auxiliary body region 26 between one of the first node 14 and the second node 16.

Although example embodiments have described above, these embodiments may be augmented or modified in a variety of ways. Any of the variations and/or alternatives discussed above in conjunction with FIGS. 11A-19 may also be applied to example embodiments illustrated in FIGS. 1A-10. More generally, the present specification discloses a number of example embodiments with a number of different features. Each of these features may be used in any combination.

Figure 20:
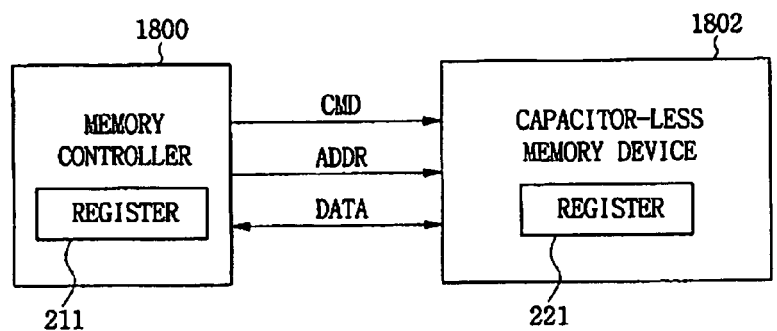
FIG. 20 illustrates a memory system in accordance with example embodiments.

FIG. 20 illustrates a memory system in accordance with example embodiments. As shown in FIG. 20, the memory system may include a memory controller 1800 and a capacitor-less memory device 1802. In example embodiments, the capacitor-less memory device 1802 may be any one of the memories discussed above in FIGS. 4, 7 and 10. Also the memory controller 1800 may be included in an integrated circuit, for example, a CPU or graphic controller, performing other specific functions.

As shown in FIG. 20, the memory controller 1800 provides commands CMD and addresses ADDR to the memory device 1802 and the memory controller 1800 and memory device 1802 exchange DATA bidirectionally.

The memory controller 1800 may include a register 211 and the memory device 1802 may include a register 221. Each of the registers 211, 221 may store information indicating whether the memory device 1802 operates in a block refresh mode or a partial refresh mode. Also, if the memory 1802 device is determined to be in the partial refresh mode, each of the registers 211, 221 may store the number of source lines or bit lines activated at one time in the partial refresh mode.

Figure 21:
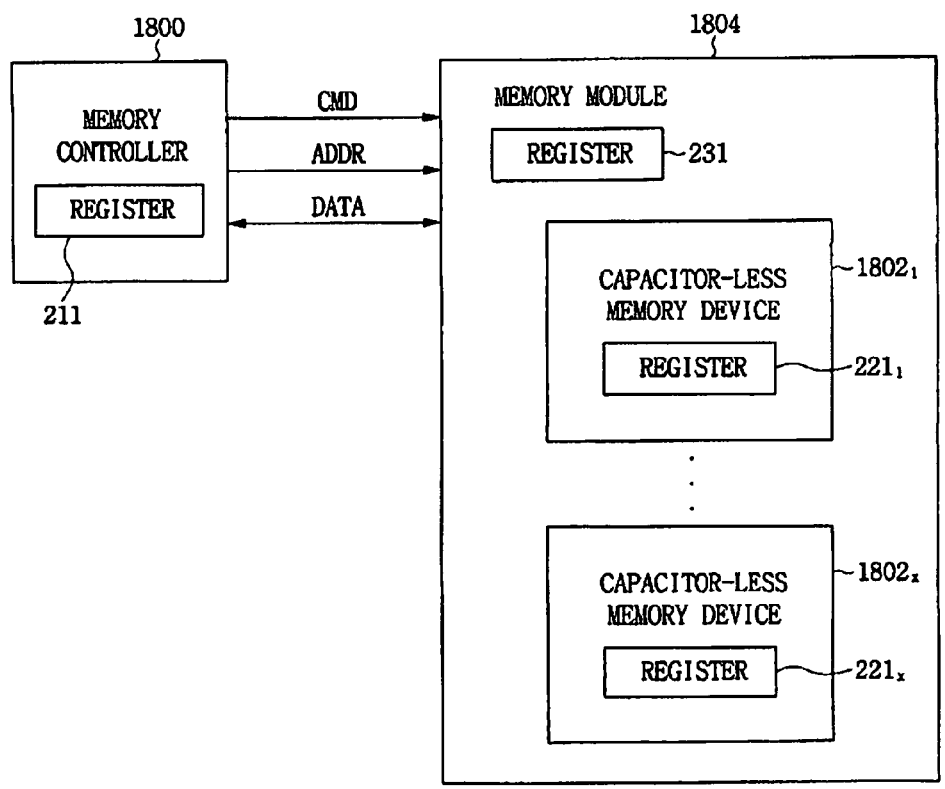
FIG. 21 illustrates another memory system in accordance with example embodiments.

As shown in FIG. 21, in example embodiments, the capacitor-less memory device 1802 may be a memory module 1804 including a plurality of capacitor-less memory devices 1802, for example, x memory devices $1802_x$, where x is an integer $\geq 1$, to increase memory capacity.

In example embodiments, the memory module 1804 may contain a register 231, for example, an EEPROM, which stores CL (CAS Latency), tRCD (RAS to CAS delay time), an indicator representing a partial refresh mode or a block refresh mode, and/or the number of source lines and/or the number of bit lines to be refreshed at one time in a partial refresh mode.

In example embodiments, the memory controller 1800 may read the stored value from the memory module register 231, write the information into the memory controller register 211 after the memory system is turned on, and then write one or more of the values to the register $221_x$ for each of the corresponding memory devices $1802_x$ in the memory module 1804, using a mode register set (MRS) command. For example, the memory controller 1800 may provide the MRS command for determining one of the block refresh mode and the partial refresh mode and then provide a refresh command for the refresh operation.

When a partial refresh is determined, the MRS command may include how many sources line (or bit lines) in the memory devices $1802_x$ are to be activated at one time in the refresh operation.

The register 211 in the memory controller 1800 and registers $221_x$ in the memory devices $1802_x$ may be modified and may be set as part of an initialization sequence that occurs when the memory system is powered up or reset.

Figure 22A:
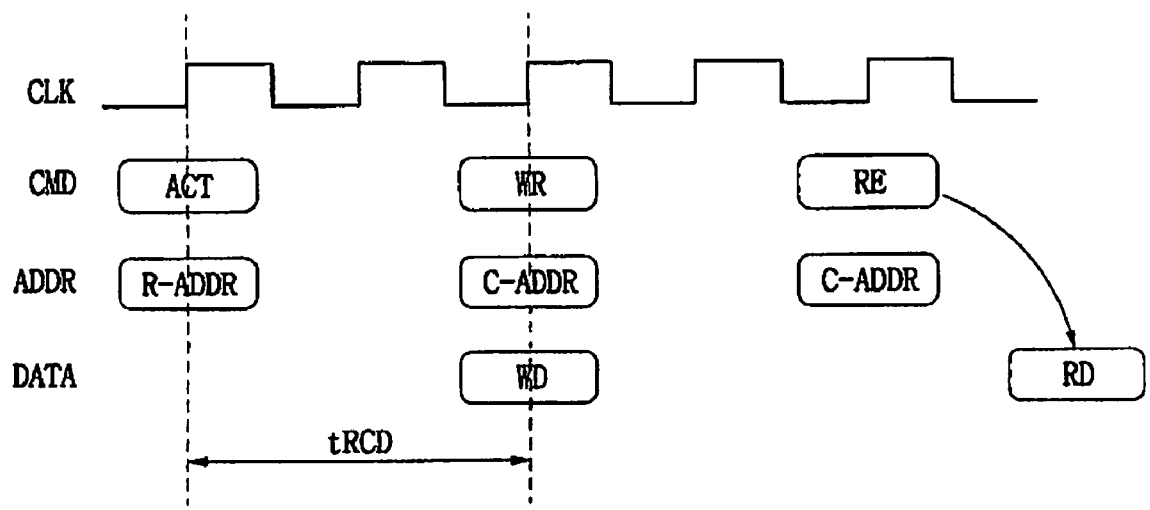
FIG. 22A illustrates a conventional timing diagram for a conventional memory system.

FIG. 22A illustrates a conventional timing diagram for a conventional memory system. As shown in FIG. 22A, in accordance with a clock signal CLK, a conventional memory controller may provide an activation command ACT along with a row address R-ADDR to activate a designated word line according to the row address. After a time delay tRCD, the memory controller may issue a write command WR, a column address C-ADDR, and provide the data to be written WD into a memory cell designated by the row address R-ADDR and the column address C-ADDR. For a read operation from a memory cell connected to the activated word line according to the row address, a conventional memory controller issues a read command RE in conjunction with the column address C-ADDR and then the data is read RD from the memory device. If the read command RE is not for the same row address, the memory controller must issue another active command ACT for the read command.

Figure 22B:
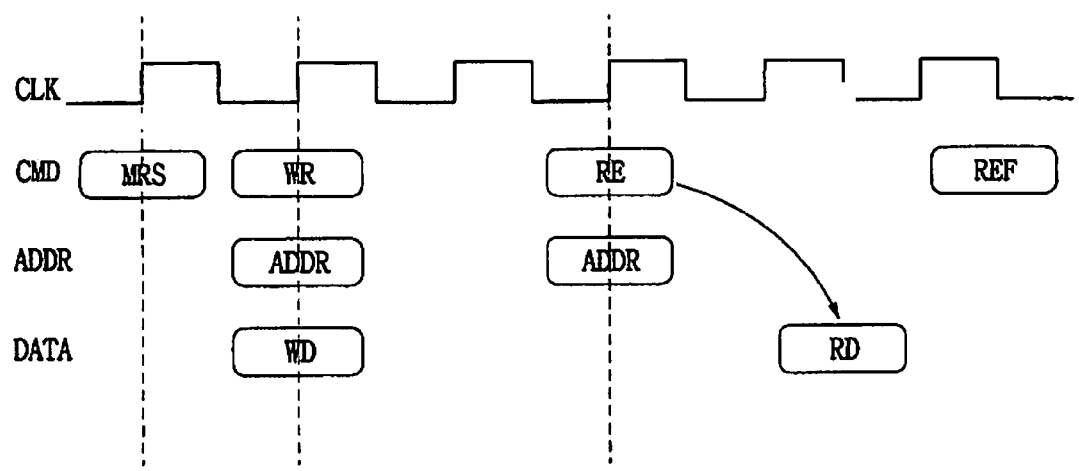
FIG. 22B illustrates a timing diagram in accordance with a memory system in accordance with example embodiments.

FIG. 22B illustrates a timing diagram in accordance with a memory system in accordance with FIG. 20 or FIG. 21. As illustrated in FIG. 22B, the memory controller need not issue a word line activate command ACT. Instead, the memory controller may output a write command WR with addresses ADDR, including a row address designating which word line is activated and a column address to select capacitor-less memory cell connected to the activated word line, and write the data WD to the selected capacitor-less memory cell in a capacitor-less memory device, as described in example embodiments illustrated above.

Additionally, the memory controller may output a read command RE with addresses ADDR including row addresses and column addresses without any preceding word line activating command ACT. As a result, a memory system in accordance with example embodiments has no tRCD delay like conventional memory devices, so that it is possible to implement higher operation system than conventional memory systems. Additionally, a memory controller in accordance with example embodiments may be implemented more simply because the memory controller outputs row addresses and column addresses at one time. In a conventional memory controller, separate control circuits are needed to output the row address and column address.

As shown in FIG. 22B, in example embodiments, the memory controller may issue an MRS command for selecting one of the block refresh mode and the partial refresh mode and if the partial refresh mode is selected, the MRS command may include how many source lines SL or bit lines BL may be activated at a time for the partial refresh operation. The memory controller may then issue a refresh command REF after the MRS command.

Any of the variations and/or alternatives discussed above in conjunction with FIGS. 20-22B may also be applied to example embodiments illustrated in FIGS. 1A-10 or 11A-19. More generally, the present specification discloses a number of example embodiments with a number of different features. Each of these features may be used in any combination.

Example embodiments being thus described, it will be obvious that the same may be varied in many ways. Such variations are not to be regarded as a departure from example embodiments, and all such modifications are intended to be included within the scope of append claims.

What is claimed:

1. A memory device, comprising:
a memory array including a plurality of memory cells, each memory cell including a floating body transistor having a first node, a second node, and a gate node, connected to at least one bit line, at least one source line and at least one word line, respectively; and
a control unit for performing a refresh operation in response to a refresh command by selecting one of the at least one source line and the at least one bit line, wherein if first data is stored at a memory cell connected to the selected line, a first current caused by bipolar junction operation flows;
wherein the control unit further performs a write operation by applying a bit line write voltage to the at least one bit line according to data information, then applying a source line write voltage to the at least one source line, and then applying a word line write voltage to the at least one word line,
wherein the source line write voltage is greater than the bit line write voltage and the word line write voltage, and
wherein a difference between the source line write voltage and the bit line write voltage for the word line write voltage induces the bipolar junction operation according to the data information.

2. The memory device of claim 1, wherein if second data is stored at the memory cell connected to the selected line, a current caused by bipolar junction operation does not flow.

3. The memory device of claim 1, each of said plurality of memory cells including a floating body region between the first node and the second node.

4. The memory device of claim 3, wherein the floating body region has a floating body length and the gate node has a gate length, wherein the gate length is less than the floating body length.

5. The memory device of claim 1, wherein the number of source lines is equal to the number of word lines.

6. The memory device of claim 5, wherein a difference between a voltage applied to the at least one source line and at least one bit line for a given voltage applied to the at least one word line induces the bipolar junction operation.

7. The memory device of claim 1, said control unit including a row control unit for controlling the at least one source line and the at least one word line and a column control unit for controlling the at least one bit line.

8. The memory device of claim 1, wherein the number of source lines is less than the number of word lines.

9. The memory device of claim 8, wherein adjacent memory cells in a bit line direction share one of the at least one source lines, the control unit further performing the refresh operation by further controlling the at least one word line.

10. A memory device, comprising:
a memory array including a plurality of memory cells, each memory cell including a floating body transistor having a first node, a second node, and a gate node, connected to at least one bit line, at least one source line and at least one word line, respectively; and
a control unit for performing a refresh operation in response to a refresh command by selecting one of the at least one source line and the at least one bit line, wherein if first data is stored at a memory cell connected to the selected line, a first current caused by bipolar junction operation flows;
wherein the control unit further performs a write operation by applying a bit line write voltage to the at least one bit line according to data information, then applying a source line write voltage to the at least one source line, and then applying a word line write voltage to the at least one word line, and
wherein said control unit further performs the write operation by applying a word line holding voltage to the at least one word line, then applying a source line holding voltage to the at least one source line, and then applying a bit line holding voltage to the at least one bit line.

11. The memory device of claim 1, wherein the control unit further performs the write operation, a read operation, and the refresh operation by applying no more than two voltage levels to the at least one word line.

12. A memory device, comprising:
a memory array including a plurality of memory cells, each memory cell including a floating body transistor having a first node, a second node, and a gate node, connected to at least one bit line, at least one source line and at least one word line, respectively; and
a control unit for performing a refresh operation in response to a refresh command by selecting one of the at least one source line and the at least one bit line, wherein if first data is stored at a memory cell connected to the selected line, a first current caused by bipolar junction operation flows;
wherein each memory cell includes,
a silicon-on-insulator structure including a substrate, an insulator, and a silicon layer, the silicon layer including the first and second nodes doped with impurities, a floating body region, and a buffer region between one of the first and second nodes and the floating body, wherein the buffer region has a lower impurity concentration that the adjacent node or the floating body and wherein the buffer region covers the entire boundary of the one of the first and second nodes, and
a gate structure including the gate node on the silicon layer.

13. The memory device of claim 12, wherein the buffer region has a height the same as the one of the first and second nodes.

14. The memory device of claim 12, wherein the buffer region contacts the insulator.

15. A memory device, comprising:
a memory array including a plurality of memory cells, each memory cell including a floating body transistor having a first node, a second node, and a gate node, connected to at least one bit line, at least one source line and at least one word line, respectively; and
a control unit for performing a refresh operation in response to a refresh command by selecting one of the at least one source line and the at least one bit line, wherein if first data is stored at a memory cell connected to the selected line, a first current caused by bipolar junction operation flows;
wherein each memory cell includes,
a silicon-on-insulator structure including a substrate, an insulator, and a silicon layer, the silicon layer including the first and second nodes doped with impurities, a floating body region having a floating body length therebetween, and a buffer region between one of the first and second nodes and the floating body, wherein the buffer region has a lower impurity concentration that the adjacent node or the floating body, and
a gate structure including the gate node and having a gate length on the silicon layer, wherein the floating body length is greater than the gate length.

16. A memory device, comprising:
a memory array including a plurality of memory cells, each memory cell including a floating body transistor having a first node, a second node, and a gate node, connected to at least one bit line, at least one source line and at least one word line, respectively; and
a control unit for performing a refresh operation in response to a refresh command by selecting one of the at least one source line and the at least one bit line, wherein if first data is stored at a memory cell connected to the selected line, a first current caused by bipolar junction operation flows;
wherein each memory cell includes,
a silicon-on-insulator structure including a substrate, an insulator, and a silicon layer, the silicon layer including the first and second nodes doped with impurities, a floating body region, and an auxiliary body region between the first node and the floating body, wherein the auxiliary body region has a lower impurity concentration than that of the floating body, and
a gate structure including the gate node on the silicon layer.

17. The memory device of claim 16, wherein the auxiliary body region covers the entire emitter/source.

18. The memory device of claim 16, wherein the floating body region is longer than the auxiliary body region.

19. A memory device, comprising:
a memory array including a plurality of memory cells, each memory cell including a floating body transistor having a first node, a second node, and a gate node, connected to at least one bit line, at least one source line and at least one word line, respectively; and
a control unit for performing a refresh operation in response to a refresh command by selecting one of the at least one source line and the at least one bit line, wherein if first data is stored at a memory cell connected to the selected line, a first current caused by bipolar junction operation flows;
wherein each memory cell includes,
a silicon-on-insulator structure including a substrate, an insulator, and a silicon layer, the silicon layer including the first and second nodes doped with impurities, a floating body region, and an extended body region adjacent to the floating body region, and
a gate structure including the gate node on the silicon layer.

20. The memory device of claim 19, wherein the extended body region extends in a direction orthogonal to a direction of the first and second nodes and the floating body.

21. The memory device of claim 19, wherein the extended body region extends in a direction under the gate structure.

22. A memory device, comprising:
a memory array including a plurality of memory cells, each memory cell including a floating body transistor having a first node, a second node, and a gate node, connected to at least one bit line, at least one source line and at least one word line, respectively; and
a control unit for performing a refresh operation in response to a refresh command by selecting one of the at least one source line and the at least one bit line, wherein if first data is stored at a memory cell connected to the selected line, a first current caused by bipolar junction operation flows;
wherein each memory cell includes,
an insulating layer on a substrate,
a silicon pattern on the insulating layer and including the first node, the second node and a floating body region, and
a gate including the gate node and surrounding the floating body region,
wherein the length of the gate is less than the floating body region and wherein a voltage difference between voltages applied to the first and second nodes for a given voltage applied to the gate induces a bipolar junction operation.

23. The memory device of claim 22, further comprising:
a buffer region between the floating body region and one of the first node and the second node, wherein the buffer region has a lower impurity concentration than that of the one of the first node and the second node.

24. A memory device, comprising:
a memory array including a plurality of memory cells, each memory cell including a floating body transistor having a first node, a second node, and a gate node, connected to at least one bit line, at least one source line and at least one word line, respectively; and
a control unit for performing a refresh operation in response to a refresh command by selecting one of the at least one source line and the at least one bit line, wherein if first data is stored at a memory cell connected to the selected line, a first current caused by bipolar junction operation flows;
wherein each memory cell includes,
an insulating layer on a substrate,
a silicon pattern on the insulating layer, which including the first node, the second node and a floating body region,
an extended body region on the floating body region, and
a gate structure including the gate node and surrounding the floating body region and the extended body region.

25. The memory device of claim 24, wherein the gate length is less than the length of the floating body region.

26. The memory device of claim 24, further comprising:
a buffer region between the floating body region and one of the first node and the second node, wherein the buffer region has a lower impurity concentration than that of the one of the first node and the second node.

27. A method for controlling a refresh operation of a memory device including a plurality of capacitor-less memory cells, comprising:
providing a mode register set command for identifying one of a block refresh operation and a partial refresh operation for the memory device; and
providing a refresh command for the refresh operation;
wherein the mode register set command further identifies how many of source lines and bit lines in the memory device are activated in the refresh operation when the partial refresh operation is determined.

28. The method of claim 27, further comprising:
providing a write command without any preceding row activation command to the memory device; and
providing write data, a first row address and a first column address to the memory device.

29. The method of claim 28, further comprising:
providing a read command without any preceding word line activating command to the memory device;
providing a second row address and a second column address to the memory device; and
receiving read data from the memory device.

30. A memory device, comprising:
a memory array including a plurality of memory cells, each memory cell including a floating body transistor having a first node, a second node, and a gate node, connected to at least one bit line, at least one source line and at least one word line, respectively; and
a control unit for performing a refresh operation in response to a refresh command by selecting one of the at least one source line and the at least one bit line, wherein if first data is stored at a memory cell connected to the selected line, a first current caused by bipolar junction operation flows;
wherein each memory cell includes,
a silicon-on-insulator structure including a substrate, an insulator, and a silicon layer, the silicon layer including first and second nodes, a floating body region, and a gate including the gate node on the floating body region,
wherein the length of gate is less than the length of the floating body, and wherein a difference between voltages applied to the first and second nodes for a given voltage applied to the gate induces a bipolar junction operation.

31. The memory device of claim 30, wherein the gate does not overlap the first and second nodes.

32. The memory device of claim 30, wherein the gate does not overlap at least one of the first and second nodes.

33. The memory device of claim 32, wherein the one the first and second nodes receives a higher applied voltage for the bipolar junction operation.

34. A memory device, comprising:
a memory array including a plurality of memory cells, each memory cell including a floating body transistor having a first node, a second node, and a gate node, connected to at least one bit line, at least one source line and at least one word line, respectively; and
a control unit for performing a refresh operation in response to a refresh command by selecting one of the at least one source line and the at least one bit line, wherein if first data is stored at a memory cell connected to the selected line, a first current caused by bipolar junction operation flows;
wherein the control unit further performs a read operation by selecting one of the at least one source line and by not selecting any of the at least one word lines, wherein if first data is stored at a memory cell connected to the selected source line, the first current caused by bipolar junction operation flows.

35. The memory device of claim 34, wherein if second data is stored at the memory cell connected to the selected source line, a second current caused by bipolar junction operation does not flow.

36. The memory device of claim 34, wherein the control unit applies the selected one of the at least one source lines with a source line read voltage and the at least one word line with a word line holding voltage.

37. The memory device of claim 36, wherein the control unit further performs a write operation by selecting one of the at least one source lines, one of the at least word lines and at least one of the at least one bit lines.

38. The memory device of claim 37, wherein the control unit for the write operation applies to the selected one of the at least one source lines a source line write voltage and applies to the selected one of the at least word lines a word line write voltage.

39. The memory device of claim 38, wherein the source line read voltage is equal to the source line write voltage.

40. The memory device of claim 37, wherein the control unit further performs the refresh operation by selecting at least two of the source lines and not selecting any of the at least one word lines.

41. The memory device of claim 40, wherein the control unit for the refresh operation applies the selected at least two of the source lines with a source line refresh voltage and applies the at least word line with the word line holding voltage.

42. The memory device of claim 41, wherein the source line read voltage is equal to the source line write voltage and the source line refresh voltage.

43. The memory device of claim 41, wherein the control unit further performs the write operation, the read operation, and the refresh operation by applying no more than the word line holding voltage and the word line write voltage to the at least one word line.

44. The memory device of claim 34, further comprising:
a sensing unit for sensing the first and the second current and being one of a voltage sense amplifier and a current sense amplifier.

45. The memory device of claim 34, each of said plurality of memory cells including a floating body region between the first node and the second node, wherein the floating body region has a floating body length and the gate has a gate length, wherein the gate length is less than the floating body length.

46. The memory device of claim 44, wherein the number of source lines is equal to the number of word lines.

* * * * *